United States Patent
Chiu et al.

(10) Patent No.: US 12,310,078 B2
(45) Date of Patent: May 20, 2025

(54) METHOD OF FORMING METAL GATE FIN ELECTRODE STRUCTURE BY ETCHING BACK METAL FILL

(71) Applicant: Taiwan Semiconductor Manufacturing Co., Ltd., Hsinchu (TW)

(72) Inventors: Shih-Hang Chiu, Taichung (TW); Wei-Cheng Wang, Hsinchu (TW); Chung-Chiang Wu, Taichung (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 430 days.

(21) Appl. No.: 17/700,998

(22) Filed: Mar. 22, 2022

(65) Prior Publication Data

US 2023/0155002 A1   May 18, 2023

Related U.S. Application Data

(60) Provisional application No. 63/278,532, filed on Nov. 12, 2021.

(51) Int. Cl.
| | | |
|---|---|---|
| H10D 64/01 | (2025.01) | |
| H01L 21/02 | (2006.01) | |
| H01L 21/28 | (2006.01) | |
| H10D 30/01 | (2025.01) | |
| H10D 30/67 | (2025.01) | |
| H10D 62/10 | (2025.01) | |

(52) U.S. Cl.
CPC ....... *H10D 64/017* (2025.01); *H01L 21/0259* (2013.01); *H01L 21/28088* (2013.01); *H10D 30/031* (2025.01); *H10D 30/6735* (2025.01); *H10D 30/6739* (2025.01); *H10D 30/6757* (2025.01); *H10D 62/118* (2025.01); *H10D 64/018* (2025.01)

(58) Field of Classification Search
CPC ..................... H01L 21/0259; H01L 21/28088
See application file for complete search history.

(56) References Cited

U.S. PATENT DOCUMENTS

| | | |
|---|---|---|
| 9,209,247 B2 | 12/2015 | Colinge et al. |
| 9,224,833 B2 | 12/2015 | Chen et al. |
| 9,251,888 B1 | 2/2016 | Liaw |
| 10,062,764 B1 * | 8/2018 | Wu ................... H01L 21/32139 |
| 11,227,956 B2 | 1/2022 | Yeong et al. |
| 2013/0187236 A1 | 7/2013 | Xie et al. |
| 2013/0260549 A1 * | 10/2013 | Jagannathan ..... H01L 21/28518 438/592 |
| 2015/0048442 A1 | 2/2015 | Colinge et al. |
| 2015/0303270 A1 | 10/2015 | Liaw |

(Continued)

FOREIGN PATENT DOCUMENTS

| | | |
|---|---|---|
| KR | 20190028061 A | 3/2019 |
| KR | 20210105801 A | 8/2021 |

(Continued)

*Primary Examiner* — Michael Jung
(74) *Attorney, Agent, or Firm* — Slater Matsil, LLP

(57) ABSTRACT

Embodiments provide a replacement metal gate in a FinFET or nanoFET which utilizes a conductive metal fill. The conductive metal fill has an upper surface which has a fin shape which may be used for a self-aligned contact.

19 Claims, 48 Drawing Sheets

(56) References Cited

U.S. PATENT DOCUMENTS

| | | | |
|---|---|---|---|
| 2016/0343827 A1* | 11/2016 | Wu | H01L 29/78 |
| 2017/0194209 A1 | 7/2017 | Li et al. | |
| 2018/0219081 A1 | 8/2018 | Greene et al. | |
| 2019/0067467 A1* | 2/2019 | Zhou | H01L 29/515 |
| 2019/0081152 A1 | 3/2019 | Suh et al. | |
| 2020/0091309 A1 | 3/2020 | Lin et al. | |
| 2021/0028290 A1* | 1/2021 | Hsiao | H01L 29/66795 |
| 2021/0257333 A1 | 8/2021 | Yan | |
| 2021/0257481 A1 | 8/2021 | Hsiao et al. | |
| 2021/0335690 A1 | 10/2021 | Huang et al. | |

FOREIGN PATENT DOCUMENTS

| | | |
|---|---|---|
| KR | 20210133840 A | 11/2021 |
| TW | 202139462 A | 10/2021 |

\* cited by examiner

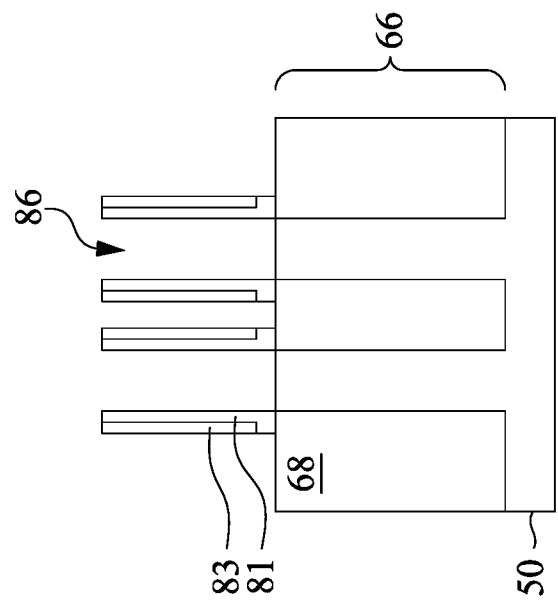

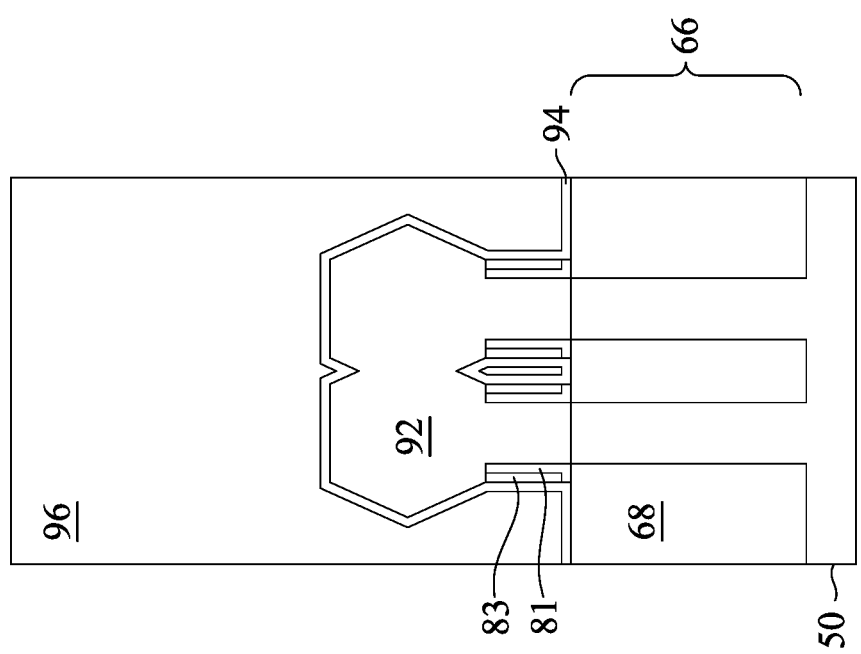

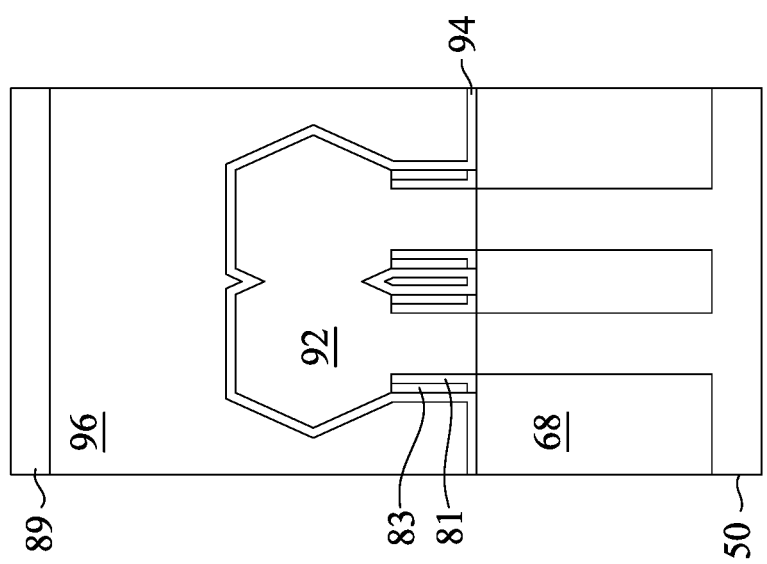

METHOD OF FORMING METAL GATE FIN ELECTRODE STRUCTURE BY ETCHING BACK METAL FILL

This application claims priority to U.S. Provisional Patent Application No. 63/278,532 filed Nov. 12, 2021, entitled "W Fin as Metal Gate Capping In Advanced Node CMOS Technology," which application is hereby incorporated by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 2C, 2D, 2E, 3A, 3B, 3C, 4A, 4B, 5A, 5B, 6A, 6B, 6C, 7A, 7B, 7C, 8, 9, 10A, 10B, 11, 12, 13, 14, 15A, 15B, 16, 17, 18A, 18B, 18C, 19A, 19B, 19C, 19D, 20A, 20B, 20C, and 20D are cross-sectional views of intermediate stages in the manufacturing of nano-FETs, in accordance with some embodiments.

DETAILED DESCRIPTION

Figure 1:
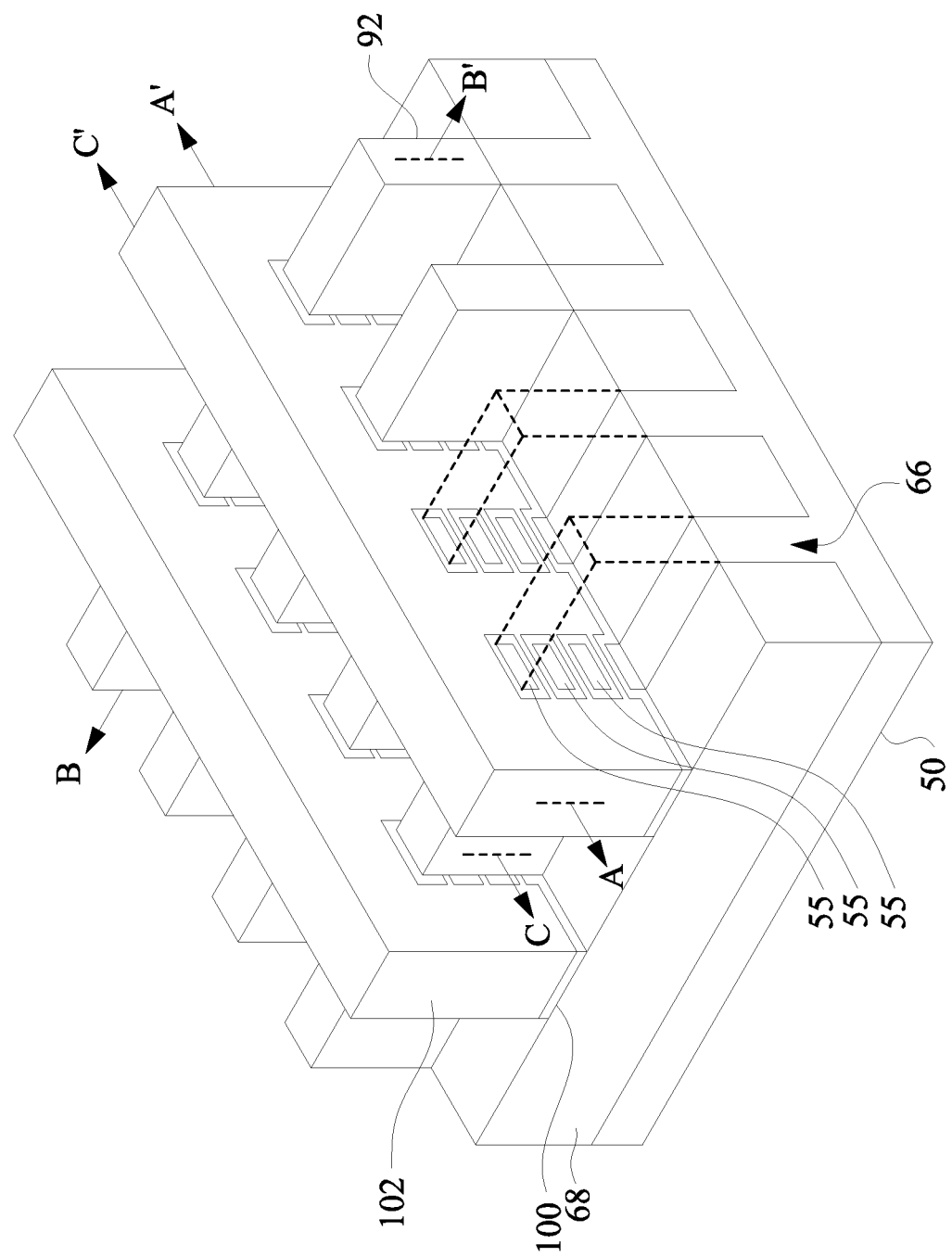
FIG. 1 illustrates an example of a nanostructure field-effect transistor (nano-FET) in a three-dimensional view, in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As gate pitch shrinks in advance technology nodes, the use of self-aligned contacts becomes necessary. Using a self-aligned contact increases the risk of etching a final structure in a way which could cause unwanted electrical issues. Therefore, the structures should be designed to help prevent such unwanted results. Embodiments provide greater gate contact for reduced gate resistance for use in a self-aligned contact scheme. When a replacement gate electrode is recessed to accommodate a gate mask, a gate fill portion of the gate contact is etched to form a fin gate electrode. When a subsequently formed gate contact is made to the fin gate electrode, the increase surface area provides a reduced gate resistance. In addition, because the height of a low-k dielectric layer can be controlled in relation to the fin gate electrode, the gapfill area over the fin gate electrode can be controlled for the subsequently formed contact.

Some embodiments are described below in a particular context, a die comprising nano-FETs. Various embodiments may be applied, however, to dies comprising other types of transistors (e.g., fin field effect transistors (FinFETs), planar transistors, or the like) in lieu of or in combination with the nano-FETs. Some embodiments are described below in the context of FinFETs as well.

FIG. 1 illustrates an example of nano-FETs (e.g., nanowire FETs, nanosheet FETs (Nano-FETs), or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2A through 20D are cross-sectional views of intermediate stages in the manufacturing of nano-FETs, in accordance with some embodiments. FIGS. 2A, 2B, 2C, 2D, 2E, 3C, 6A, 7A, 10A, 18A, 19A, and 20A illustrate reference cross-section A-A' illustrated in FIG. 1. FIGS. 3B, 4B, 5B, 6B, 7B, 8, 9, 10B, 11, 12, 13, 14, 15A, 15B, 16, 17, 18B, 19B, and 20B illustrate reference cross-section B-B' illustrated in FIG. 1. FIGS. 3A, 4A, 5A, 6C, 7C, 18C, 19D, and 20D illustrate reference cross-section C-C' illustrated in FIG. 1. FIGS. 19C and 20C illustrate reference cross-sections parallel to the reference cross-section B-B' illustrated in FIG. 1.

Figure 2A:
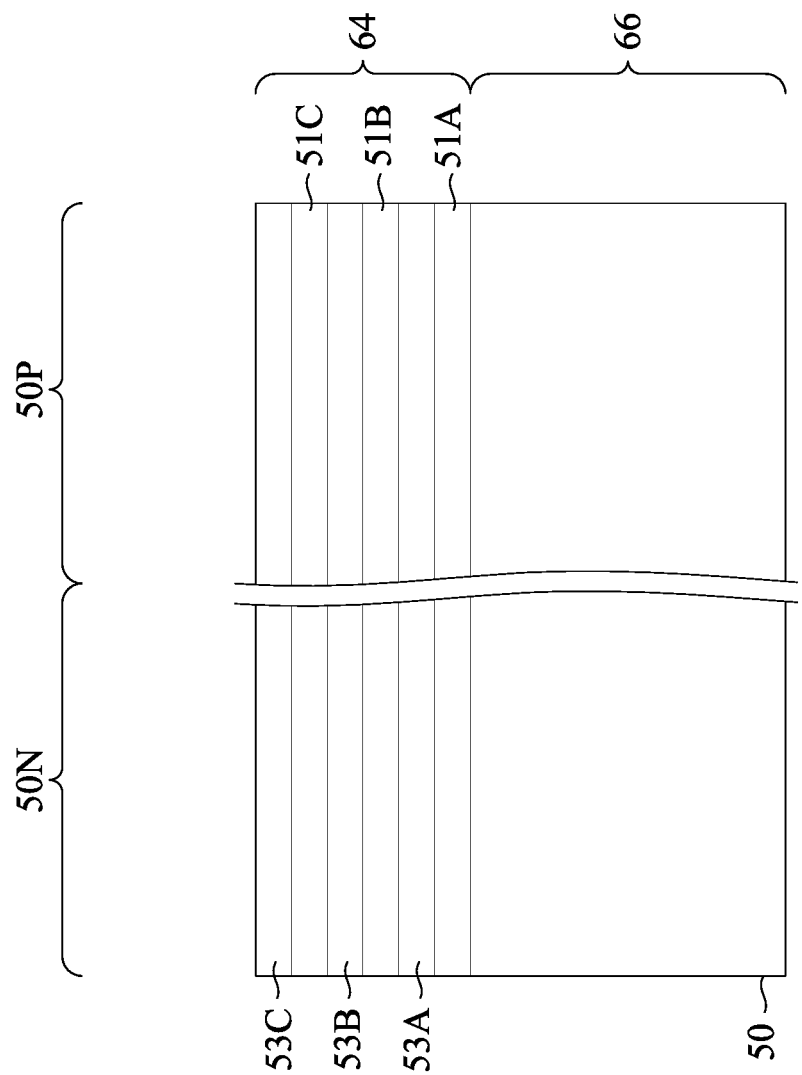
Figure 2B:
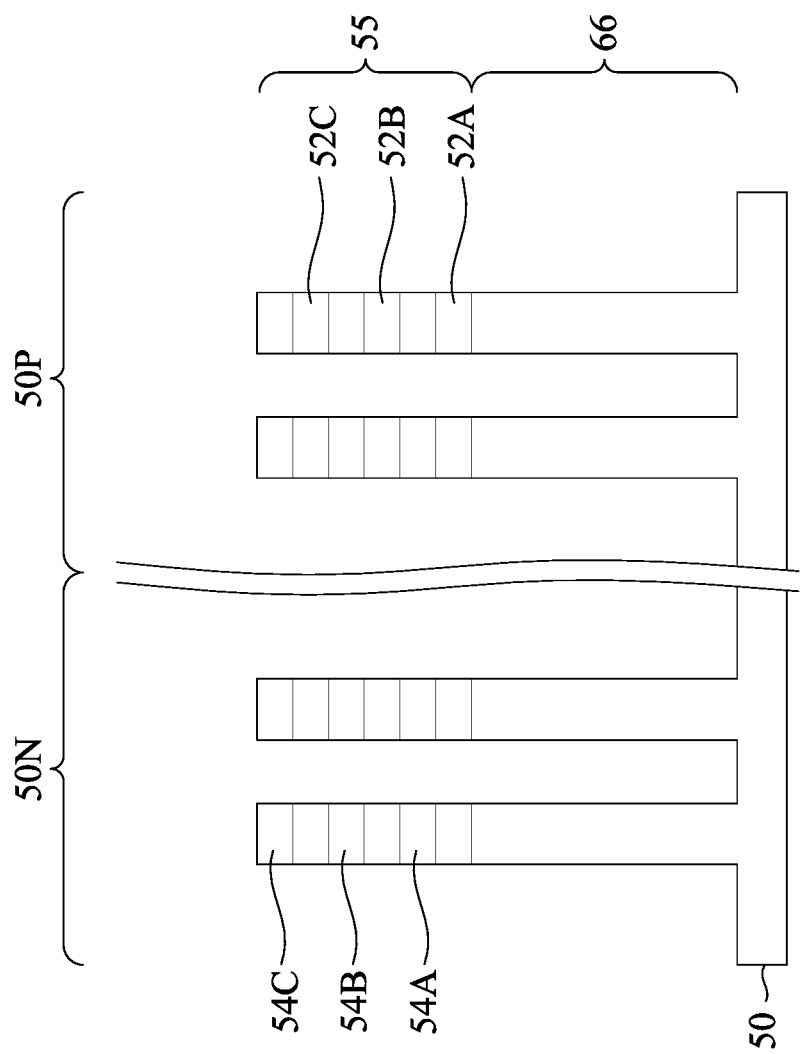
Figure 2C:
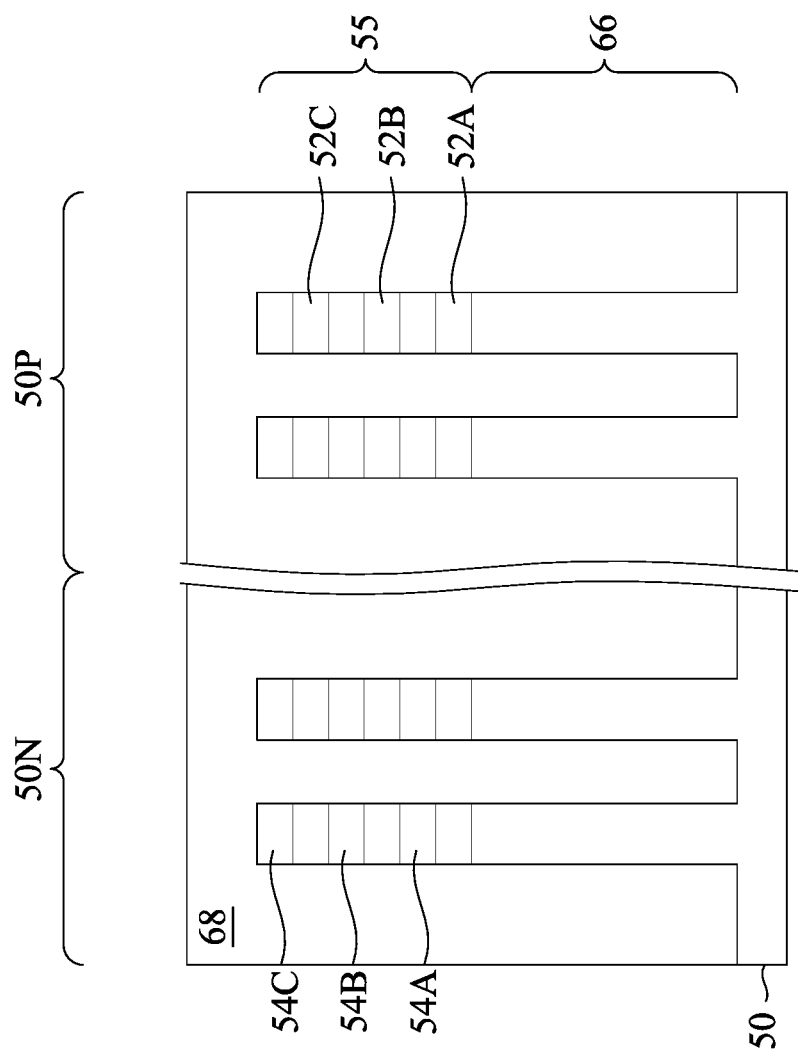
Figure 2D:
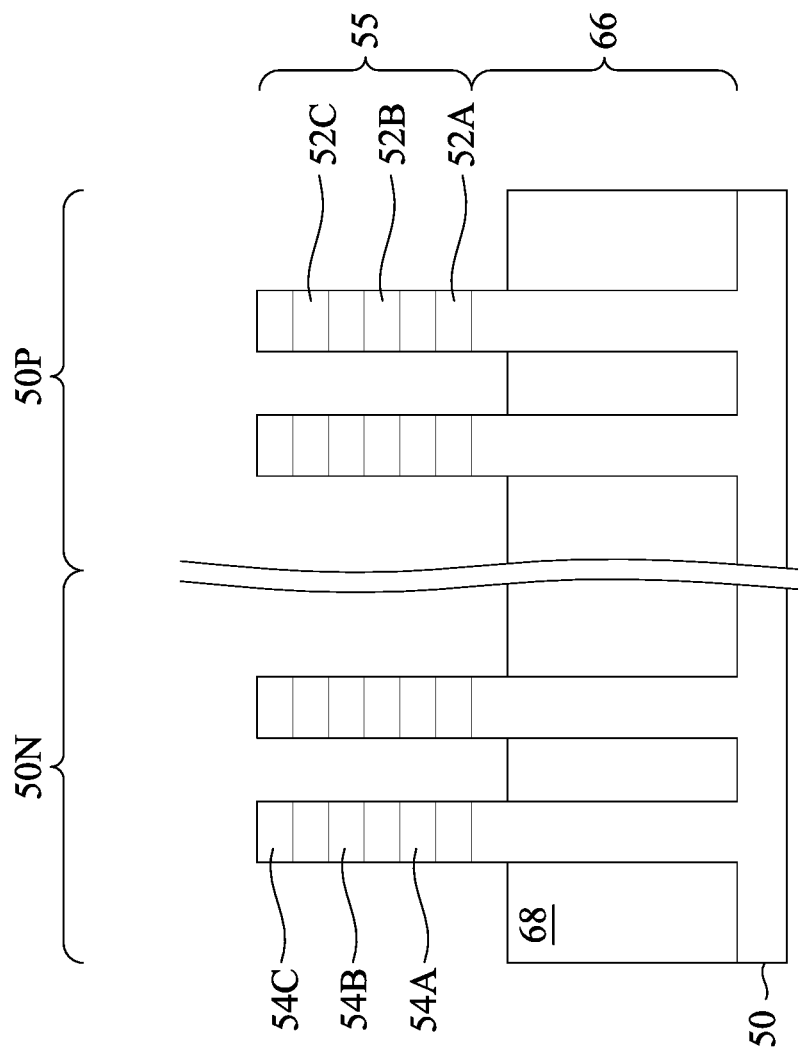

In FIGS. 2A and 2B, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIGS. 2A and 2B, a multi-layer stack 64 (FIG. 2A) is formed over the substrate 50 and then patterned into nanostructures 55 (FIG. 2B). The multi-layer stack 64 includes alternating layers of first semiconductor layers 51 and second semiconductor layers 53. The first semiconductor layers 51 are patterned in the forming of nanostructures 55, described below, to form the first nanostructures 52A-52C (collectively referred to as first nanostructures 52). The second semiconductor layers 53 are patterned in the forming of nanostructures 55 to form the second nanostructures 54A-54C (collectively referred to as second nanostructures 54). For purposes of illustration and as discussed in greater detail below, the second semiconductor layers 53 are removed and the first semiconductor layers 51 are patterned to form channel regions of nano-FETs in the p-type region 50P. Also, the first semiconductor layers 51 are removed and the second semiconductor layers 53 are patterned to form channel regions of nano-FETs in the n-type region 50N. Nevertheless, in some embodiments the first semiconductor layers 51 may be removed and the second semiconductor layers 53 may be patterned to form channel regions of nano-FETs in the p-type region 50P, and the second semiconductor 53 layers may be removed and the first semiconductor layers 51 may be patterned to form channel regions of nano-FETs in the n-type region 50N.

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of non-FETs in both the n-type region 50N and the p-type region 50P. In such embodiments, the channel regions in both the n-type region 50N and the p-type region 50P may have a same material composition (e.g., silicon, or another semiconductor material) and be formed simultaneously. FIGS. 21A, 21B, 21C, and 21D illustrate a structure resulting from such embodiments where the channel regions in both the p-type region 50P and the n-type region 50N comprise silicon, for example.

The multi-layer stack 64, patterned as nanostructures 55, is illustrated as including three layers of each of the first semiconductor layers 51 (e.g., corresponding to first nanostructures 52) and the second semiconductor layers 53 (e.g., corresponding to second nanostructures 54) for illustrative purposes. In some embodiments, the multi-layer stack 64 (prior to patterning as nanostructures 55) may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 (corresponding to first nanostructures 52) may be formed of a first semiconductor material suitable for p-type nano-FETs, such as silicon germanium, or the like, and the second semiconductor layers 53 (corresponding to second nanostructures 54) may be formed of a second semiconductor material suitable for n-type nano-FETs, such as silicon, silicon carbon, or the like. The multi-layer stack 54 (patterned as nanostructures 55) is illustrated as having a bottommost semiconductor layer suitable for p-type nano-FETs for illustrative purposes. In some embodiments, the multi-layer stack may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETs.

Still referring to FIGS. 2A and 2B, fins 66 are formed in the substrate 50 and nanostructures 55 are formed from the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C(collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

The fins 66 in the n-type region 50N and the p-type region 50P are illustrated as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

After patterning the fins 66 and nanostructures 55, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers (and resulting first nanostructures 52) and the second semiconductor layers (and resulting second nanostructures 54) are illustrated and discussed herein as comprising the same materials in the p-type region 50P and the n-type region 50N for illustrative purposes only. As such, in some embodiments one or both of the first semiconductor layers and the second semiconductor layers may be different materials or formed in a different order in the p-type region 50P and the n-type region 50N.

Further in FIGS. 2A and 2B, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about 1013 atoms/cm$^3$ to about 1014 atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about 1013 atoms/cm$^3$ to about 1014 atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 2E:
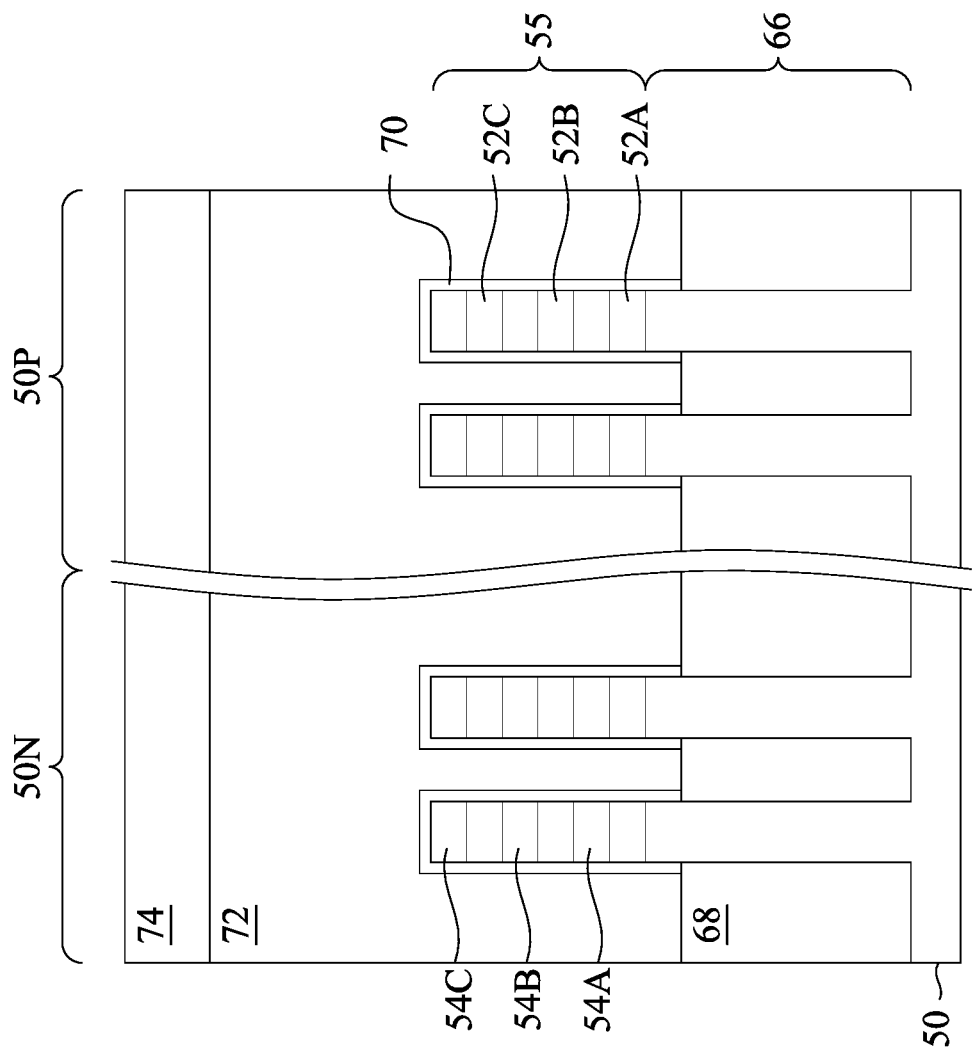

In FIG. 2E, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

FIGS. 3A through 20D illustrate various additional steps in the manufacturing of embodiment devices. FIGS. 3A, 4A, 5A, 6A, 6C, 7A, 7C, 18C, 19D, and 20D illustrate features in either the n-type regions 50N or the p-type regions 50P.

Figure 3A:
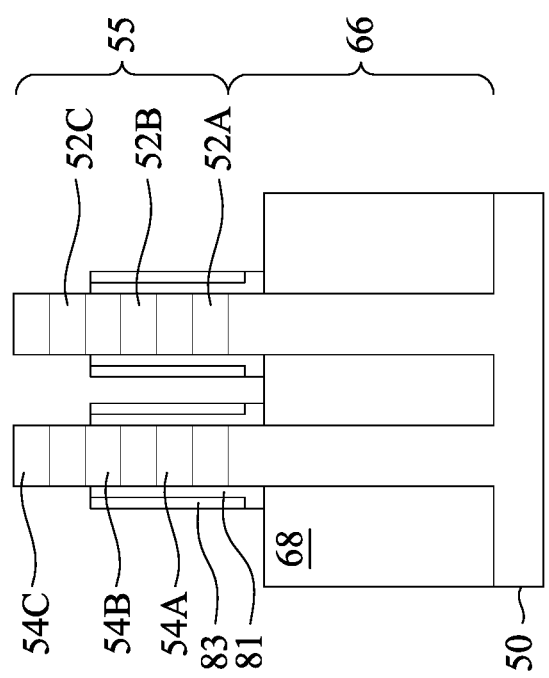
Figure 3B:
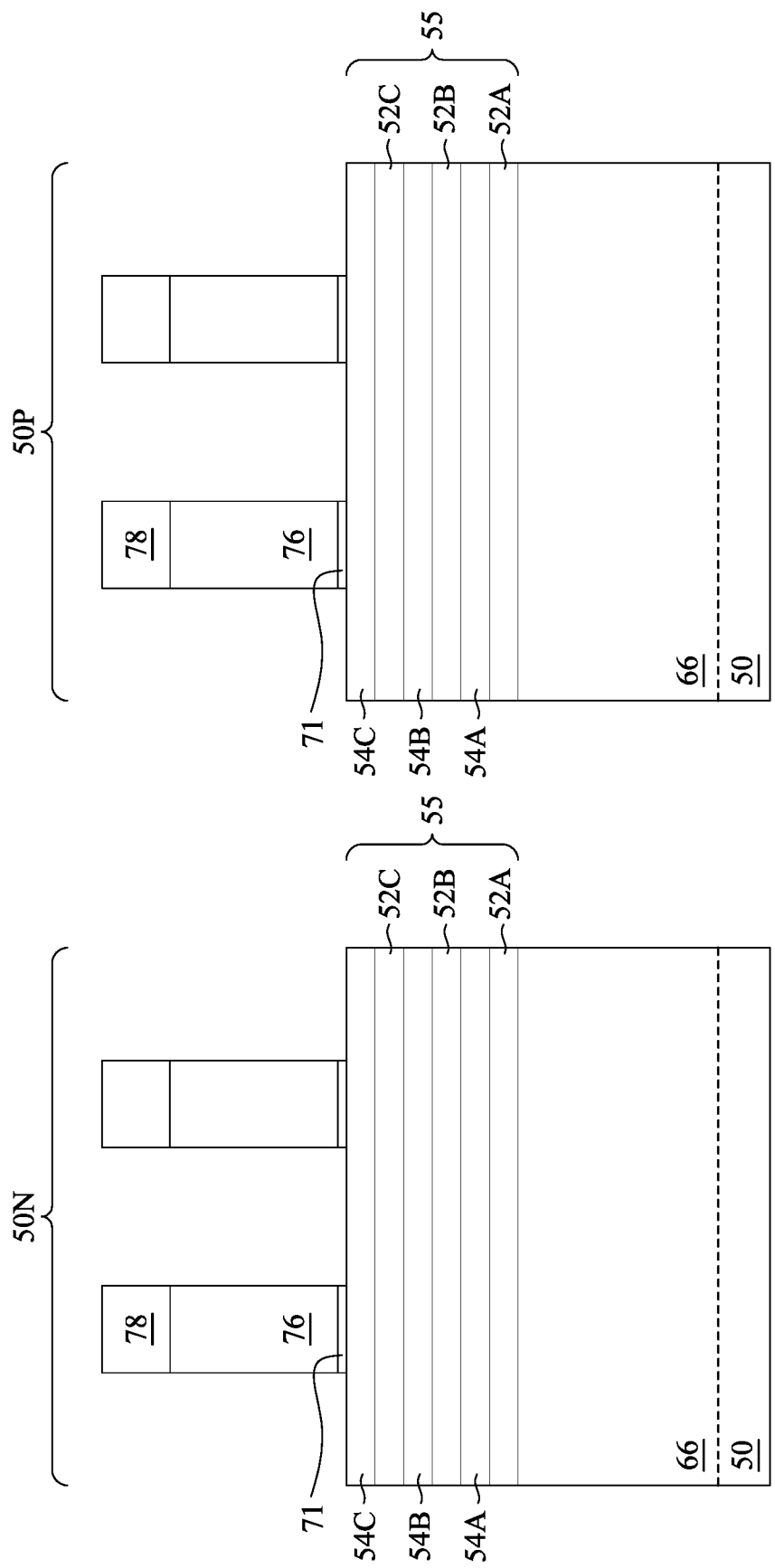
Figure 3C:
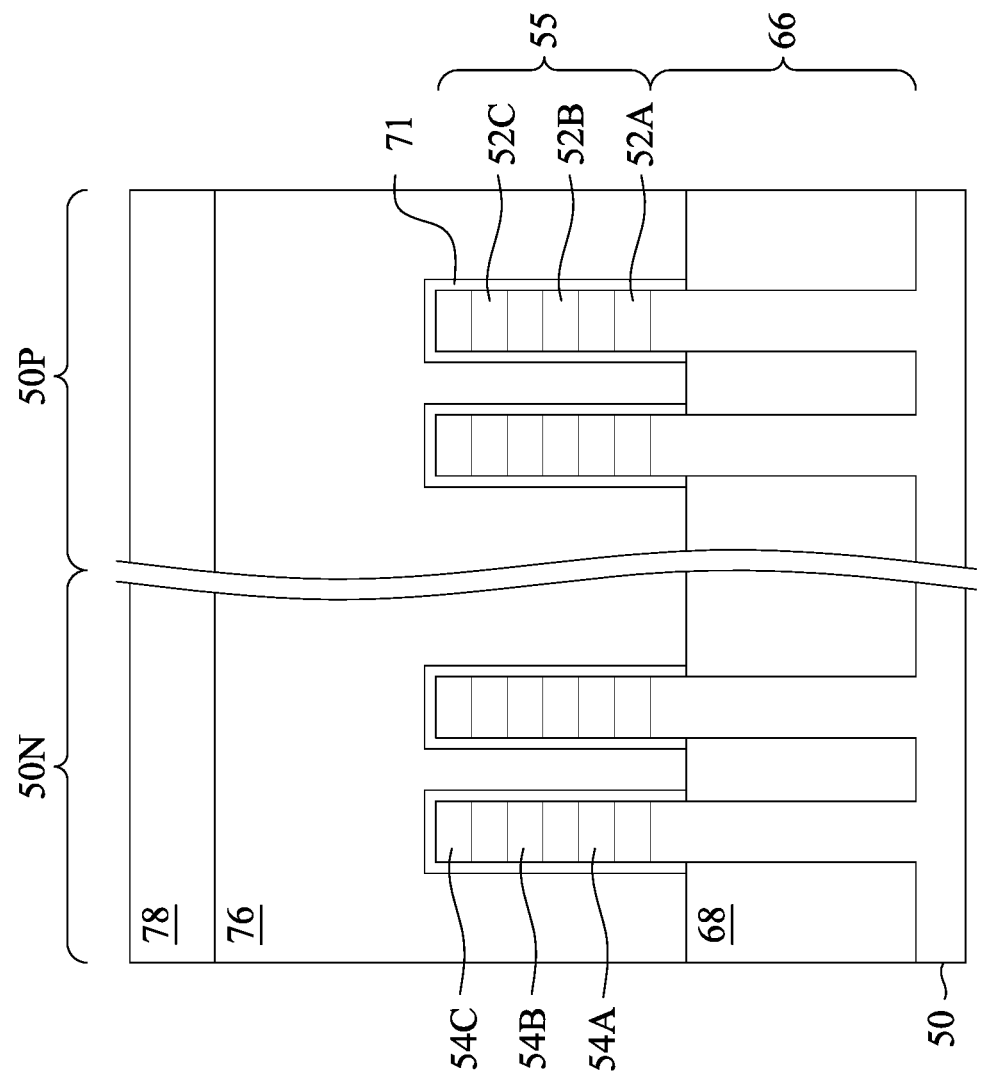

In FIGS. 3A, 3B, and 3C, the mask layer 74 (see FIG. 2E) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Next, a first spacer layer and a second spacer layer are formed over the structures as illustrated in FIGS. 3A, 3B, and 3C, and etched to form first spacers 81 and second spacers 83, respectively. After forming the first spacer layer and the second spacer layer, they are subsequently patterned to act as spacers for forming self-aligned source/drain regions. The first spacer layer is formed on top surfaces of the STI regions 68; top surfaces and sidewalls of the fins 66, the nanostructures 55, and the masks 78; and sidewalls of the dummy gates 76 and the dummy gate dielectric 71. The second spacer layer is deposited over the first spacer layer. The first spacer layer may be formed of silicon oxide, silicon nitride, silicon oxynitride, or the like, using techniques such as thermal oxidation or deposited by CVD, ALD, or the like. The second spacer layer may be formed of a material having a different etch rate than the material of the first spacer layer, such as silicon oxide, silicon nitride, silicon oxynitride, or the like, and may be deposited by CVD, ALD, or the like.

After the first spacer layer is formed and prior to forming the second spacer layer, implants for lightly doped source/drain (LDD) regions (not separately illustrated) may be performed. In embodiments with different device types, similar to the implants discussed above in FIGS. 2A and 2B, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Next, the first spacer layer and the second spacer layer are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer and the second spacer layer may be etched using a suitable etching process, such as an isotropic etching process (e.g., a wet etching process), an anisotropic etching process (e.g., a dry etching process), or the like. In some embodiments, the material of the second spacer layer has a different etch rate than the material of the first spacer layer, such that the first spacer layer may act as an etch stop layer when patterning the second spacer layer and such that the second spacer layer may act as a mask when patterning the first spacer layer. For example, the second spacer layer may be etched using an anisotropic etch process wherein the first spacer layer acts as an etch stop layer, wherein remaining portions of the second spacer layer form second spacers 83 as illustrated in FIG. 3A. Thereafter, the second spacers 83 acts as a mask while etching exposed portions of the first spacer layer, thereby forming first spacers 81 as illustrated in FIG. 3A.

As illustrated in FIG. 3A, the first spacers 81 and the second spacers 83 are disposed on sidewalls of the fins 66 and/or nanostructures 55. As illustrated in FIG. 3B, in some embodiments, the second spacer layer and the first spacer layer may each be removed adjacent the masks 78, the dummy gates 76, and the dummy gate dielectrics 71. In some embodiments, only the second spacer layer may be removed, and the first spacers 81 may remain disposed on sidewalls of the masks 78, the dummy gates 76, and the dummy dielectric layers 60. In other embodiments, a portion of the second spacers 83 may remain over the first spacers 81 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer), additional spacers may be formed and removed, and/or the like. Furthermore, the n-type and p-type devices may be formed using different structures and steps.

Figure 4B:
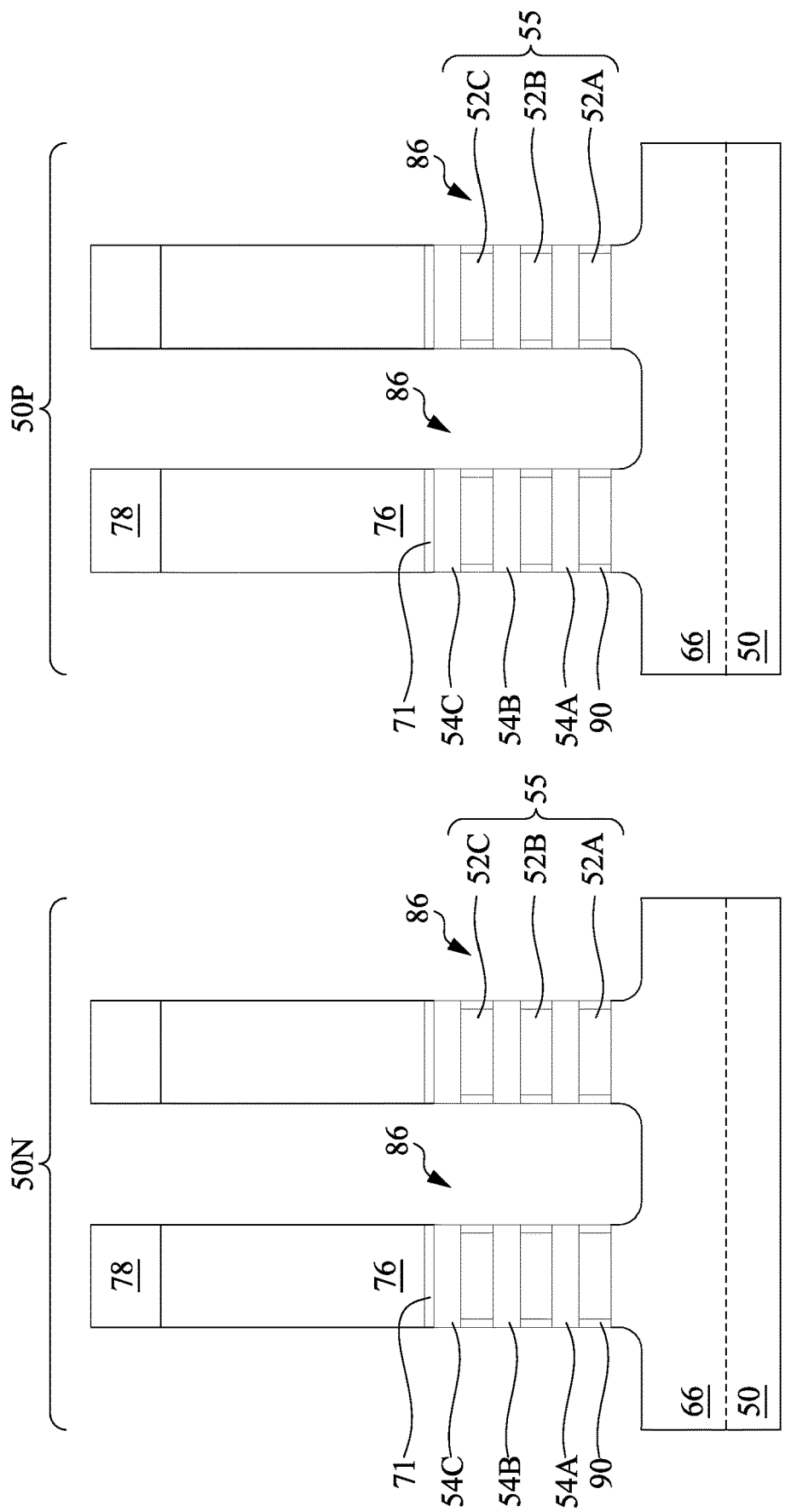

In FIGS. 4A and 4B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 4A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Next, portions of sidewalls of the layers of the nanostructures 55 formed of the first semiconductor materials (e.g., the first nanostructures 52) exposed by the first recesses 86 are etched to form sidewall recesses (corresponding to the illustrated first inner spacers 90) in the n-type region 50N, and portions of sidewalls of the layers of the nanostructures 55 formed of the second semiconductor materials (e.g., the second nanostructures 54) exposed by the first recesses 86 are etched to form sidewall recesses in the p-type region 50P. Although sidewalls of the first nanostructures 52 and the second nanostructures 54 in sidewall recesses are illustrated as being straight, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52 in the n-type region 50N, and a wet or dry etch process with hydrogen fluoride, another fluorine-based etchant, or the like may be used to etch sidewalls of the second nanostructures 54 in the p-type region 50P.

After forming the sidewall recesses, first inner spacers 90 are formed in the sidewall recesses. The first inner spacers 90 act as isolation features between subsequently formed source/drain regions and a gate structure. As will be discussed in greater detail below, source/drain regions will be formed in the first recesses 86, while the first nanostructures 52 in the n-type region 50N and the second nanostructures 54 in the p-type region 50P will be replaced with corresponding gate structures.

The first inner spacers 90 may be formed by depositing an inner spacer layer (not separately illustrated) over the structures. The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Moreover, although the outer sidewalls of the first inner spacers 90 are illustrated as being straight in FIG. 4B, the outer sidewalls of the first inner spacers 90 may be concave or convex. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 5A-5C) by subsequent etching processes, such as etching processes used to form gate structures.

Figure 5A:
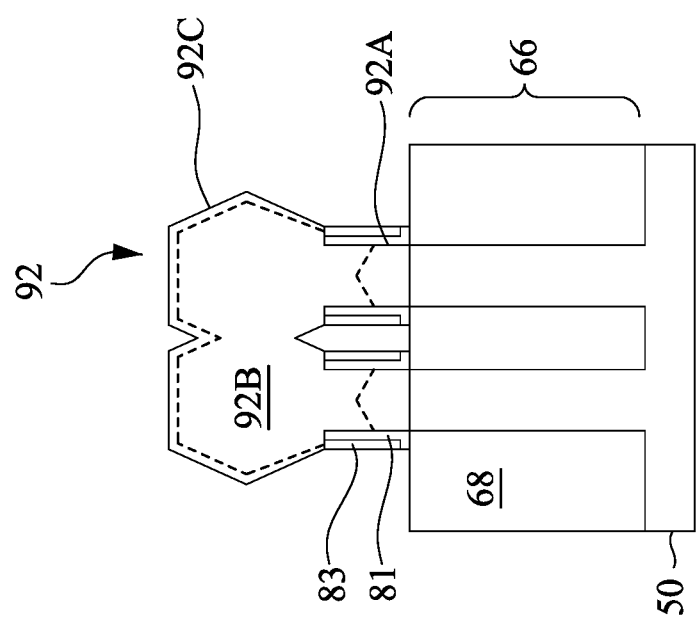
Figure 5B:
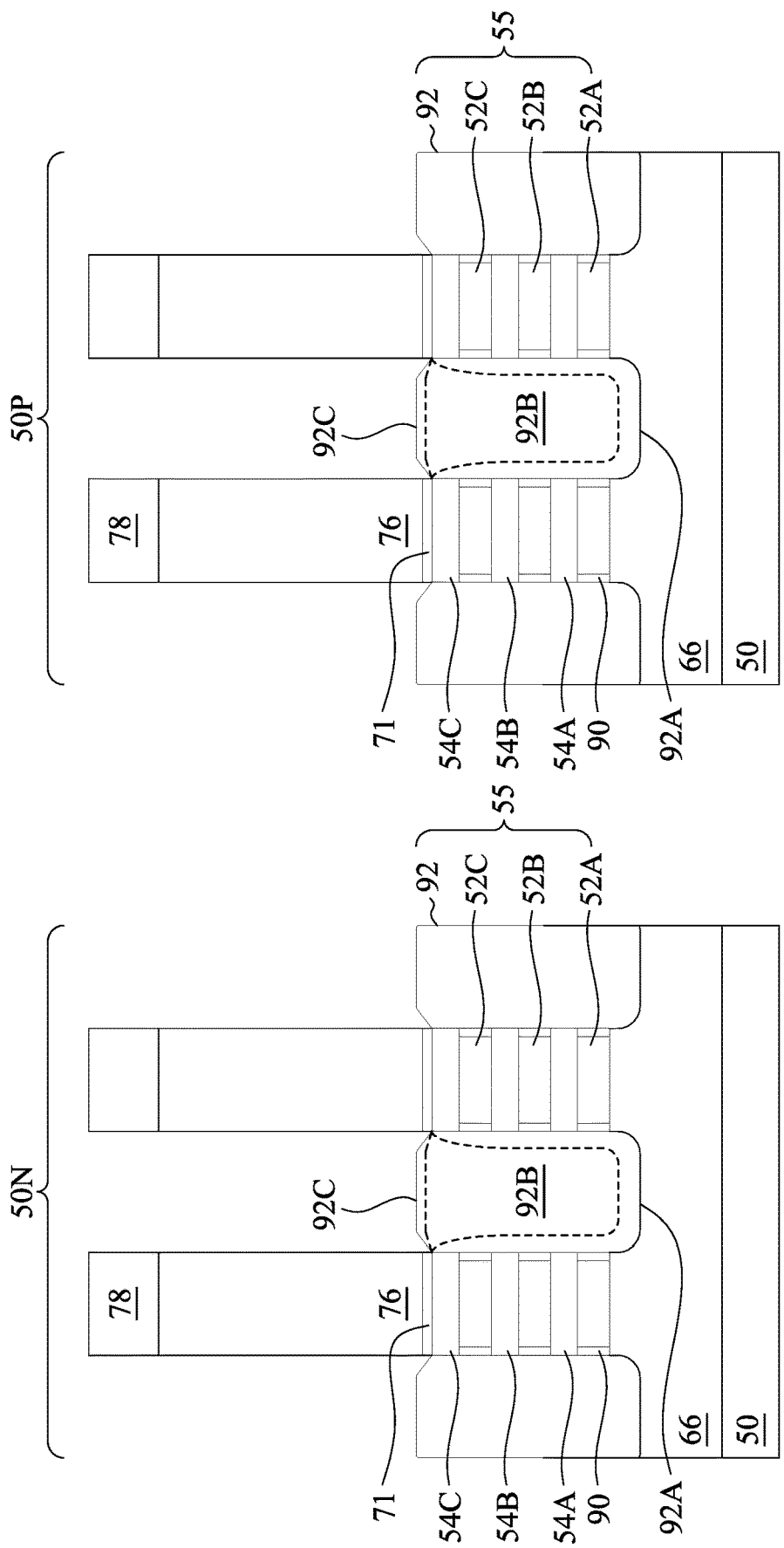

In FIGS. 5A-5C, epitaxial source/drain regions 92 are formed in the first recesses 86. In some embodiments, the epitaxial source/drain regions 92 may exert stress on the second nanostructures 54 in the n-type region 50N and on the first nanostructures 52 in the p-type region 50P, thereby improving performance. As illustrated in FIG. 5B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the nanostructures 55 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 5A. In other embodiments, adjacent epitaxial source/drain regions 92 remain separated after the epitaxy process is completed. The first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 6A:
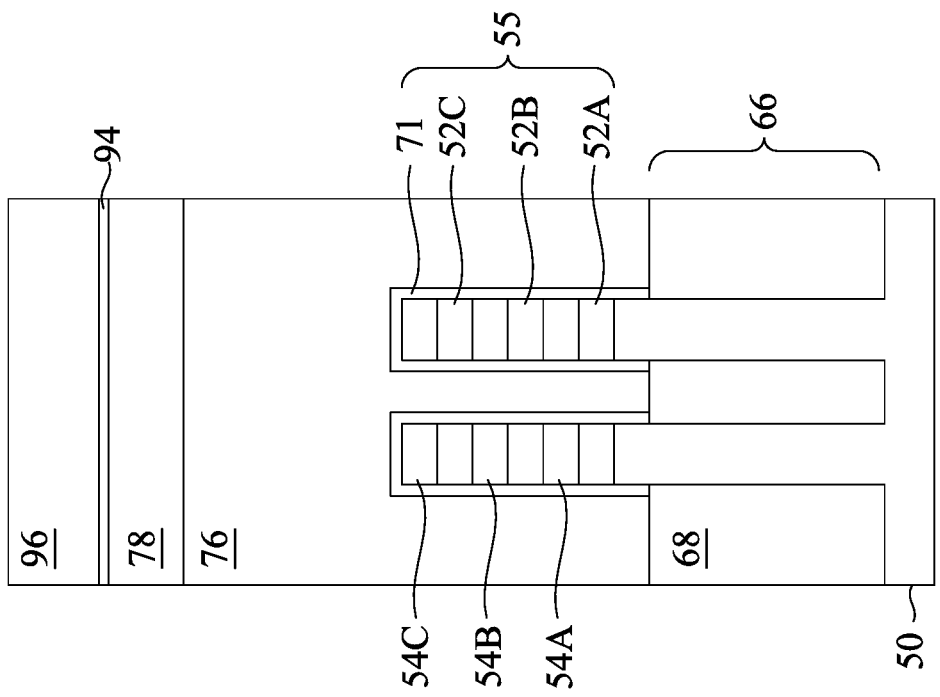
Figure 6B:
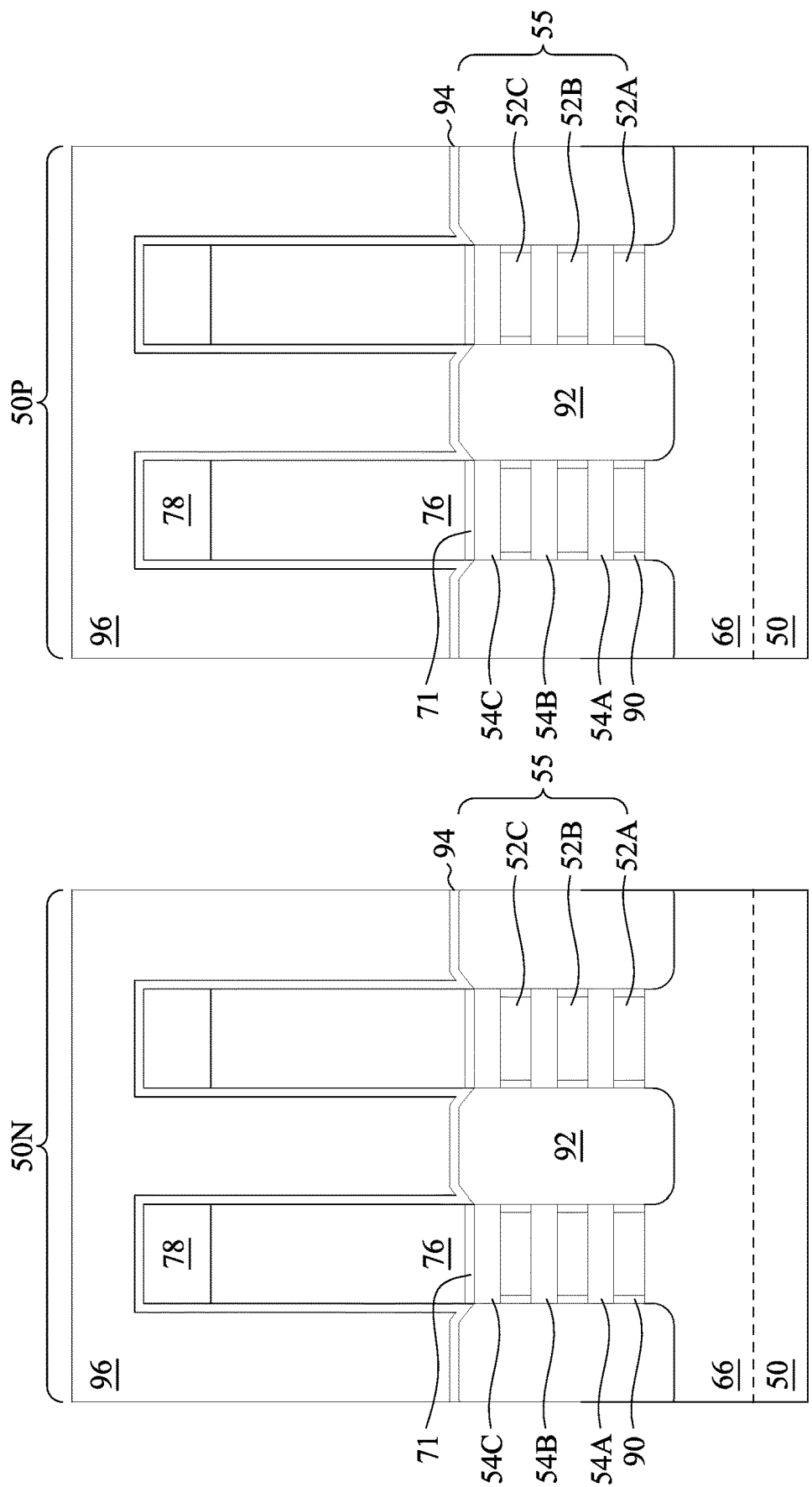

In FIGS. 6A, 6B, and 6C, a first interlayer dielectric (ILD) 96 is deposited over the structure illustrated in FIGS. 3C, 5B, and 5A, (the processes of FIGS. 4A-5B do not alter the cross-section illustrated in FIG. 3C), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 7A:
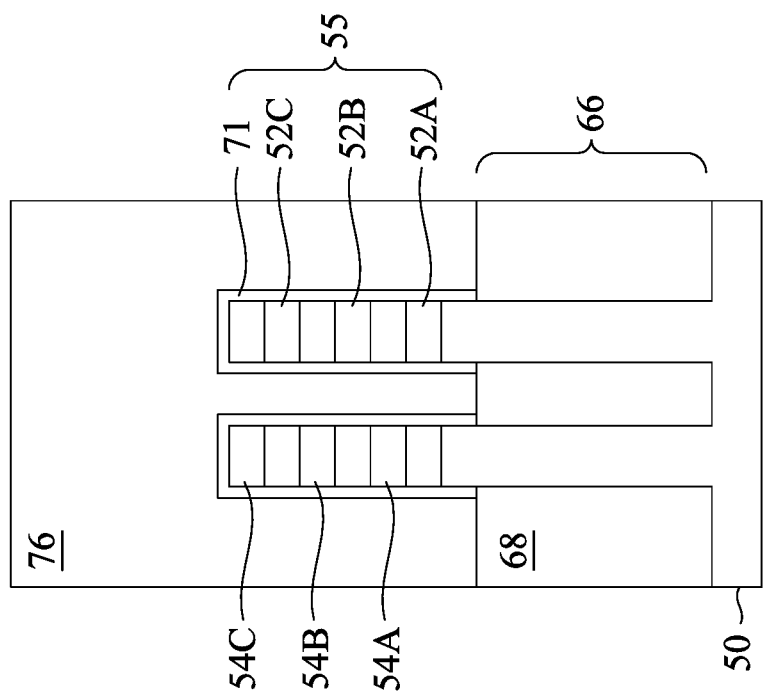
Figure 7B:
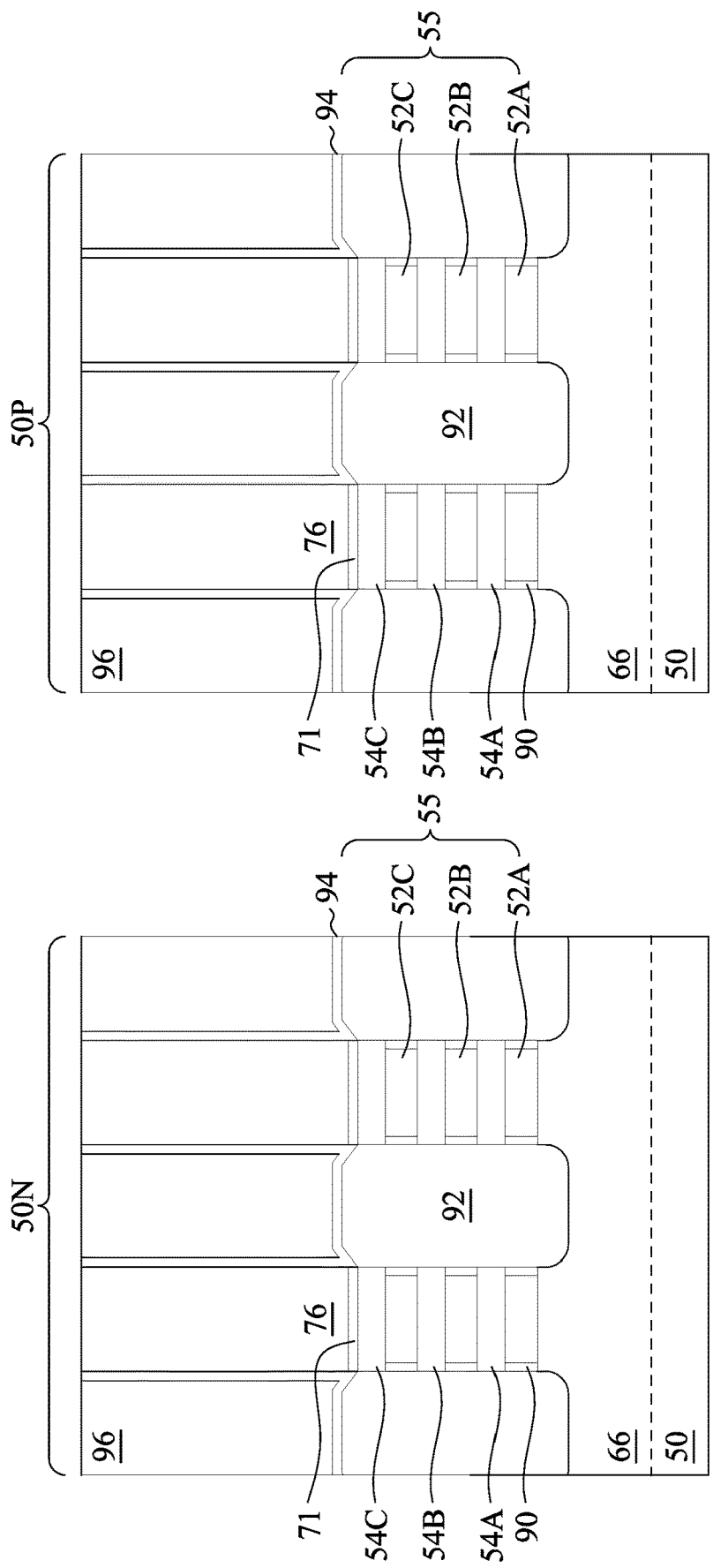
Figure 7C:
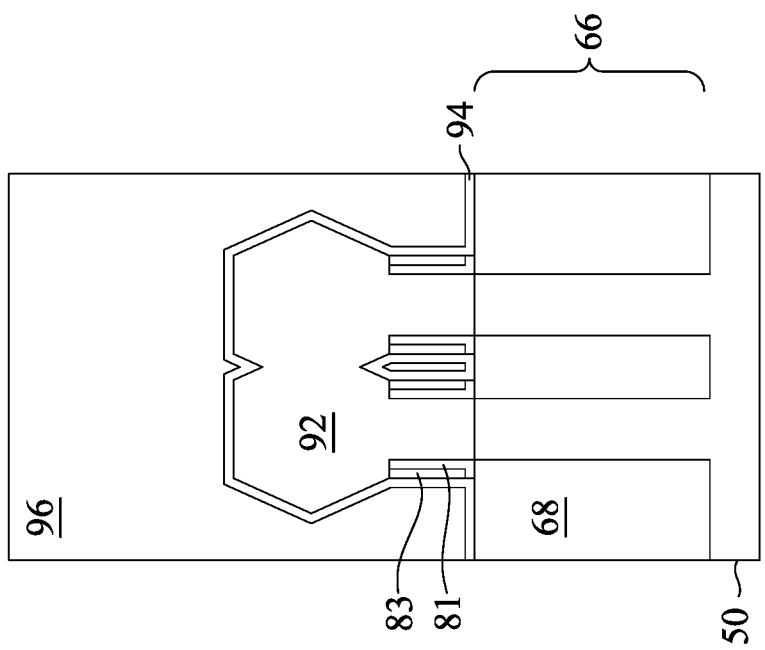

In FIGS. 7A-7C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 8:
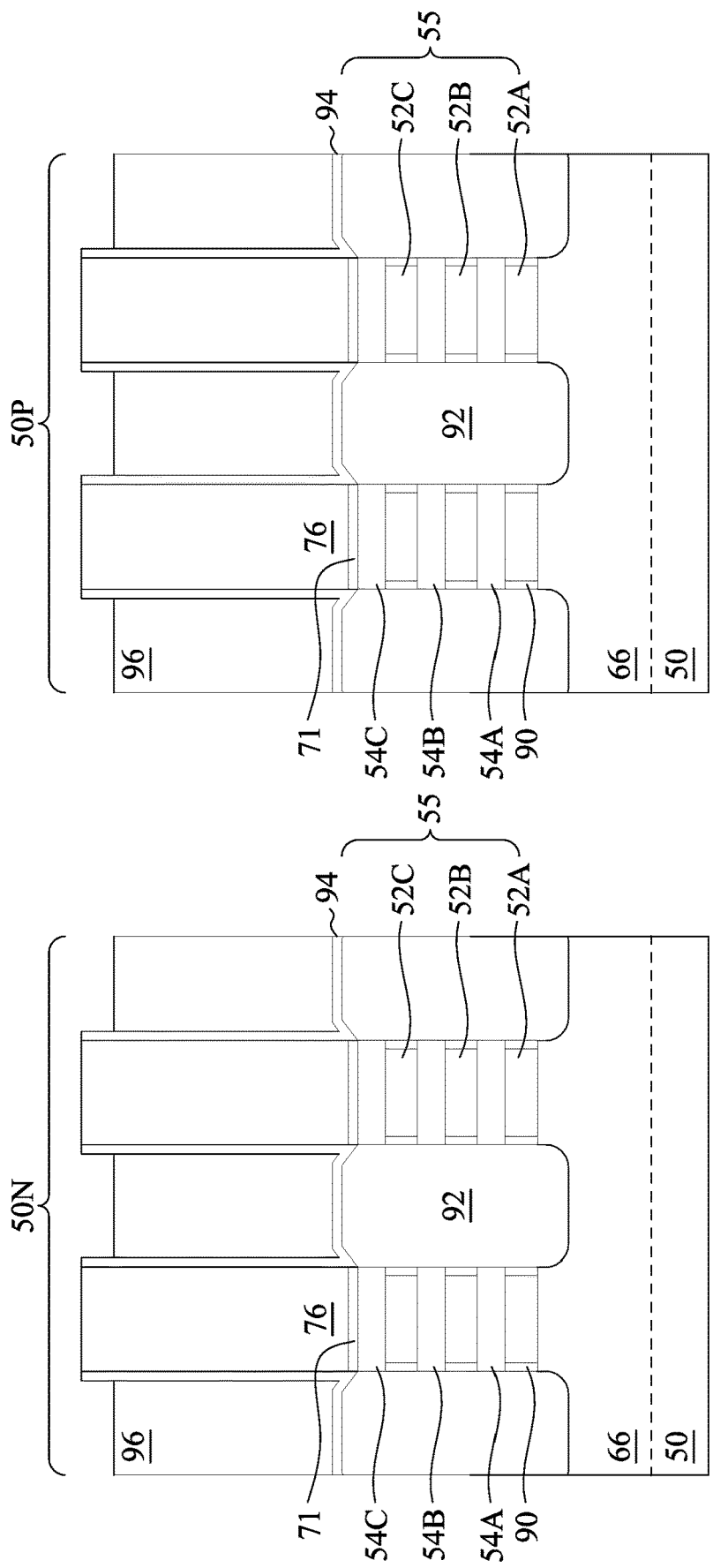

In FIG. 8, following the planarization process, the upper surface of the first ILD 96 may be recessed using an acceptable etching process, such as one that is selective to the material of the first ILD 96 (e.g., etches the material of the first ILD 96 at a faster rate than the material of the dummy gates 76). For example, an oxide removal using, for example, dilute hydrofluoric (dHF) acid may be used.

Figure 9:
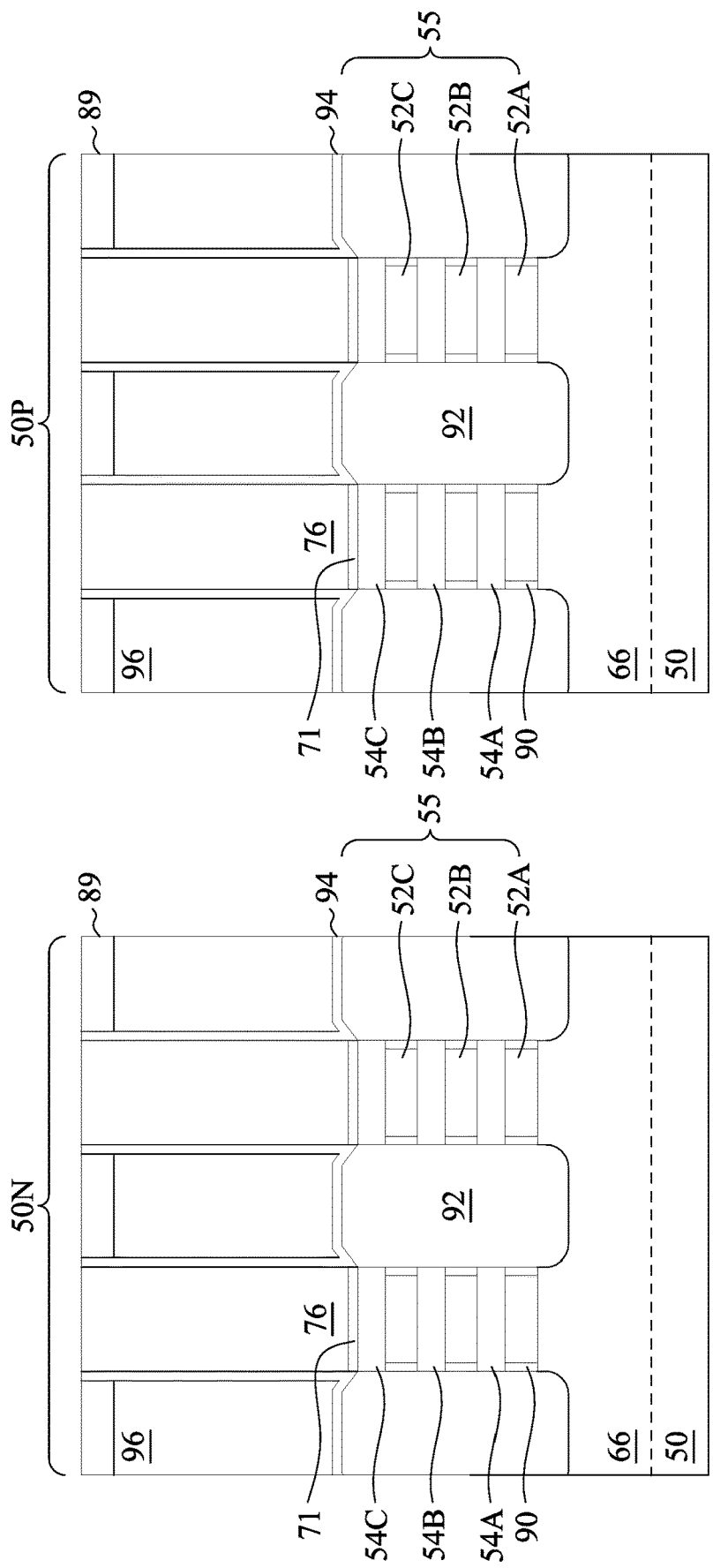

In FIG. 9, after recessing the first ILD 96, a self-align mask 89 may be deposited in the recesses and then the upper surface of the self-align mask 89 may be planarized to again expose the upper surfaces of the dummy gates 76.

Figure 10A:
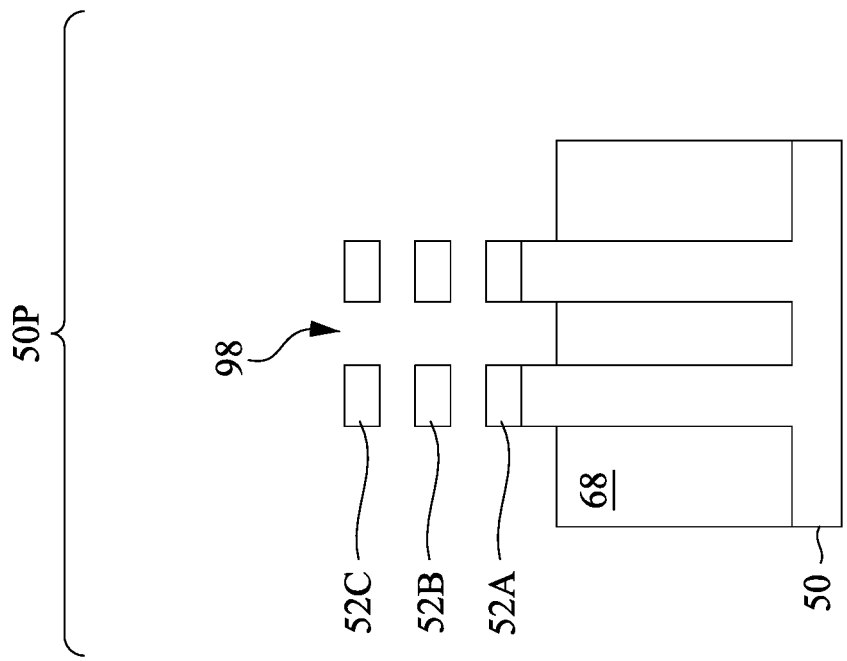
Figure 10A:
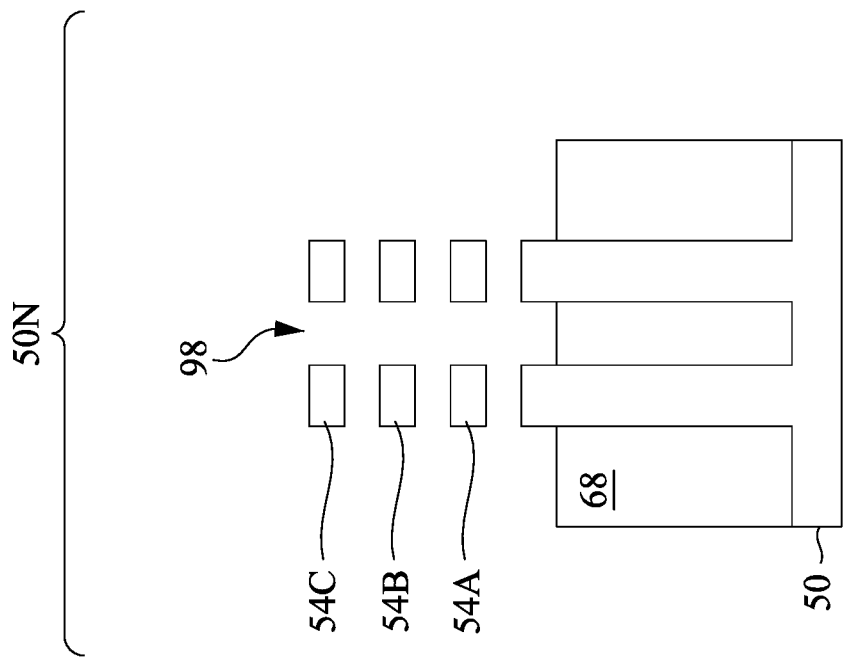
Figure 10B:
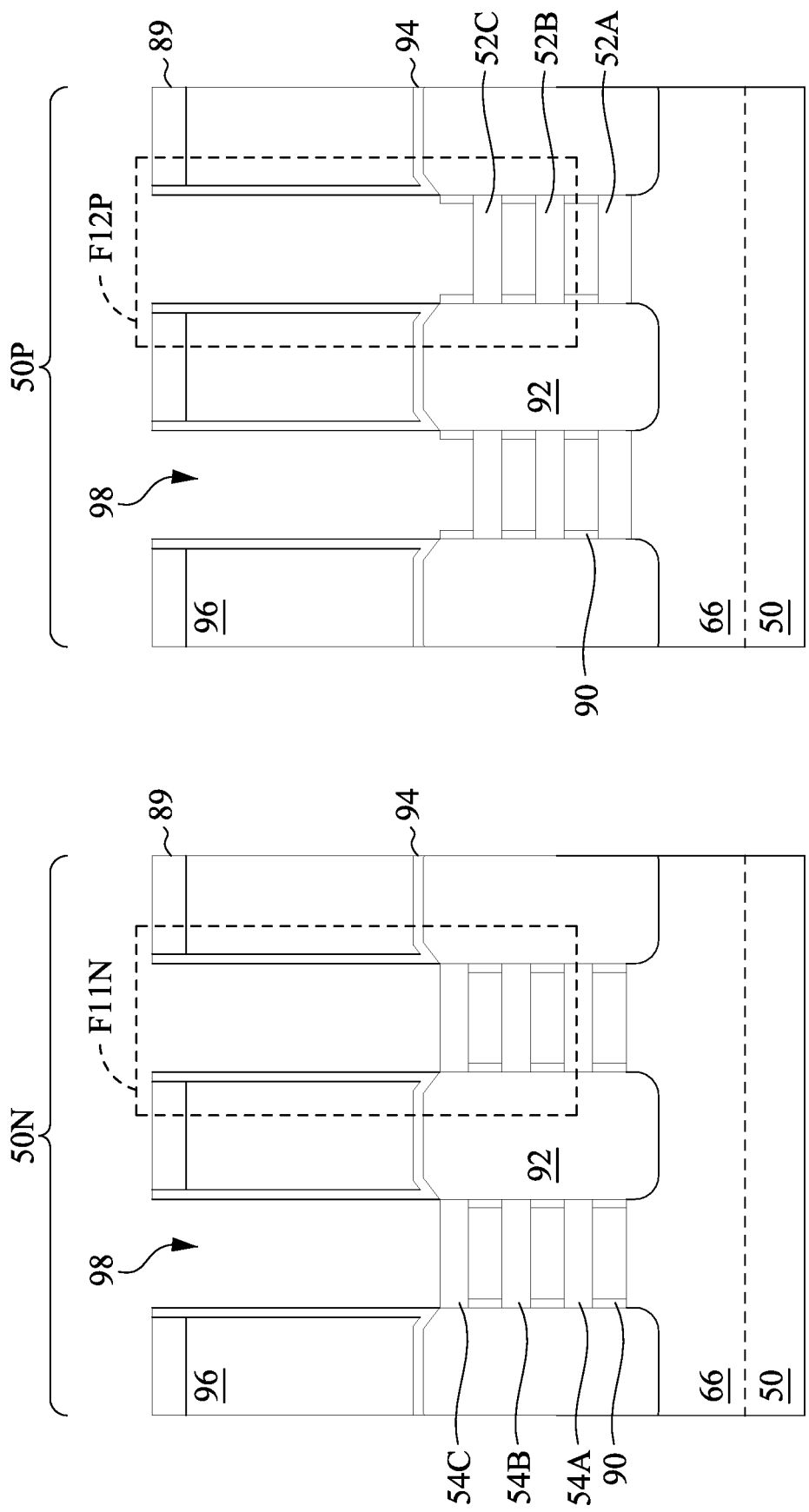

In FIGS. 10A and 10B, the dummy gates 76, and the masks 78 if present, are removed in one or more etching steps, so that second recesses 98 are formed. Portions of the dummy dielectric layers 60 in the second recesses 98 are also be removed. In some embodiments, the dummy gates 76 and the dummy dielectric layers 60 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 60 may be used as etch stop layers when the dummy gates 76 are etched. The dummy dielectric layers 60 may then be removed after the removal of the dummy gates 76.

The first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH$_4$OH), or the like may be used to remove the first nanostructures 52 in the n-type region 50N.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously, for example by removing the first nanostructures 52 in both the n-type region 50N and the p-type region 50P or by removing the second nanostructures 54 in both the n-type region 50N and the p-type region 50P. In such embodiments, channel regions of n-type nano-FETs and p-type nano-FETS may have a same material composition, such as silicon, silicon germanium, or the like. FIGS. 21A, 21B, 21C, and 21D illustrate a structure resulting from such embodiments where the channel regions in both the p-type region 50P and the n-type region 50N are provided by the second nanostructures 54 and comprise silicon, for example.

In FIGS. 11 through 14, replacement gates are formed to wrap around the channel regions in the n-type region 50N and in the p-type region 50P. The views in FIGS. 11 through 14 are enlarged views of continuing processes performed in the areas of the dashed boxes F11N and F11P in FIG. 10B for the n-type region 50N and the p-type region 50P, respectively.

Figure 11:
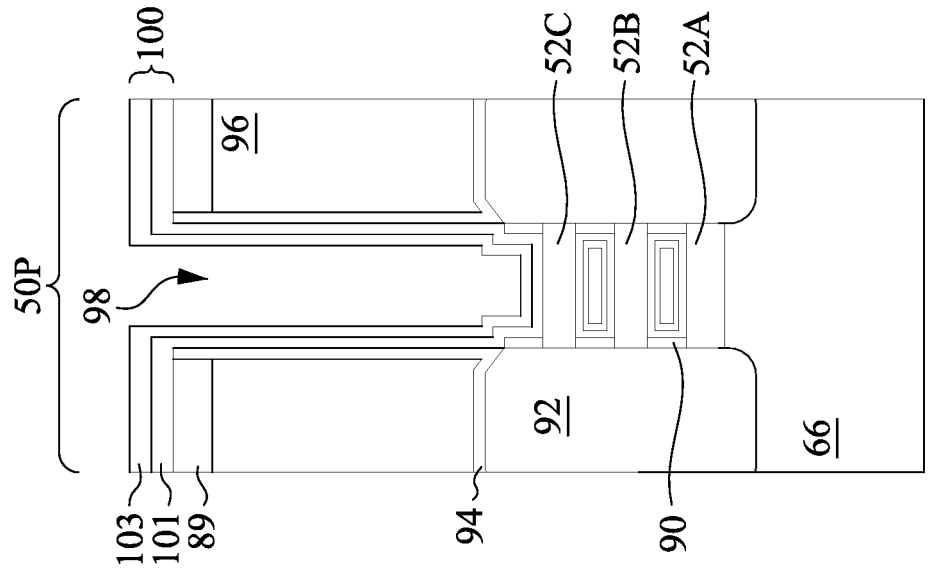
Figure 11:
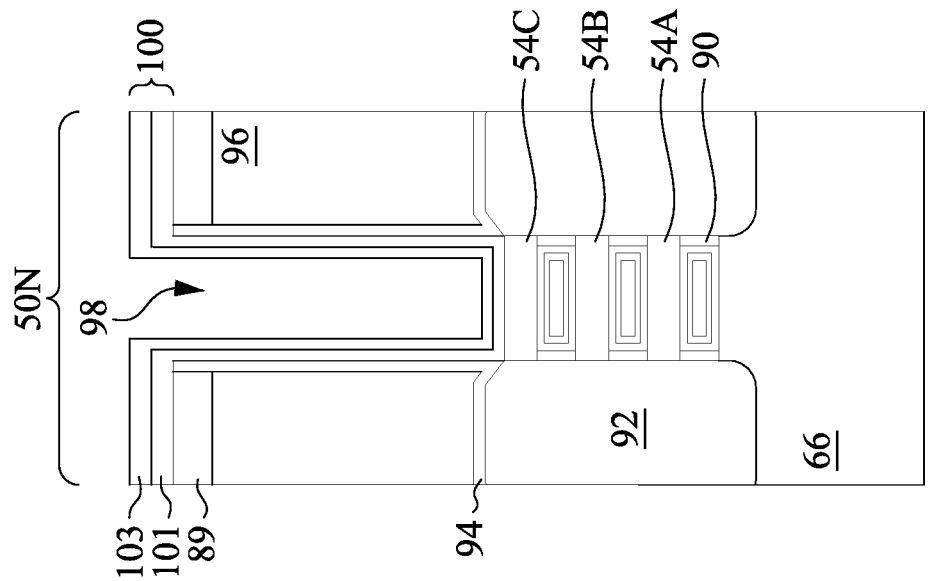

In FIG. 11, gate dielectric layers 100 are formed for the replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nanostructures 52. The gate dielectric layers 100 may also be deposited on top surfaces of the self-align mask 89, the CESL 94, the first spacers 81 (if present), and the STI regions 68.

In accordance with some embodiments, the gate dielectric layers 100 comprise one or more dielectric layers, such as an oxide, a metal oxide, the like, or combinations thereof. For example, in some embodiments, the gate dielectric layers 100 may comprise a first gate dielectric 101 (e.g., comprising silicon oxide, or the like) and a second gate dielectric 103 (e.g., comprising a metal oxide, or the like) over the first gate dielectric 101. In some embodiments, the first gate dielectric 101 may be a low-k material (having a k value less than about 3.9), such as silicon nitride, silicon carbide, silicon oxide, low-k dielectrics such as carbon doped oxides, extremely low-k dielectrics such as porous carbon doped silicon dioxide, the like, or a combination thereof. The second gate dielectric 103 may include a dielectric material having an opposite k value, a high k value versus a low k value, and in these embodiments, the second gate dielectric 103 may have a k value greater than about 7.0, and may include a metal oxide or a silicate of hafnium, aluminum, zirconium, lanthanum, manganese, barium, titanium, lead, or combinations thereof, for example, hafnium oxide, aluminum oxide, zirconium oxide, lanthanum oxide, manganese oxide, barium oxide, titanium oxide, or lead oxide.

The structure of the gate dielectric layers 100 may be the same or different in the n-type region 50N and the p-type region 50P. For example, the n-type region 50N may be masked or exposed while forming the gate dielectric layers 100 in the p-type region 50P. In embodiments where the n-type region 50N is exposed, the gate dielectric layers 100 may be simultaneously formed in the n-type regions 50N. The formation methods of the gate dielectric layers 100 may include molecular-beam deposition (MBD), ALD, PECVD, PEALD and the like.

Figure 12:
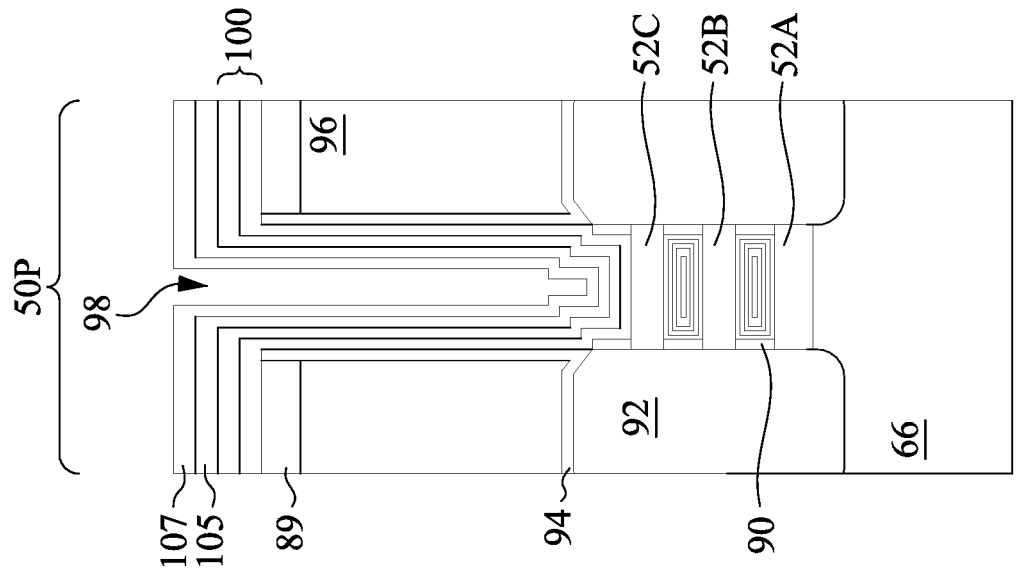
Figure 12:
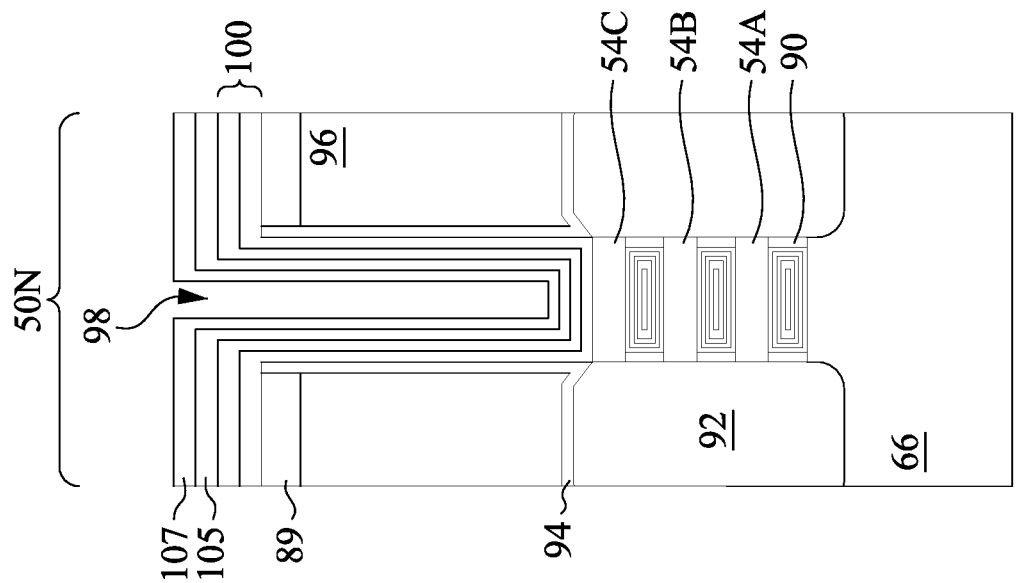
Figure 13:
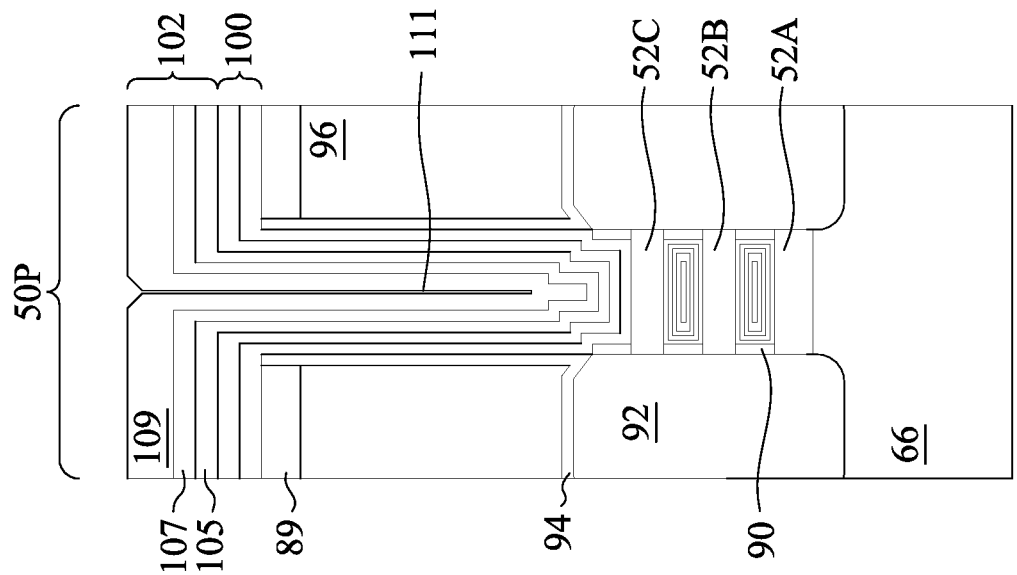
Figure 13:
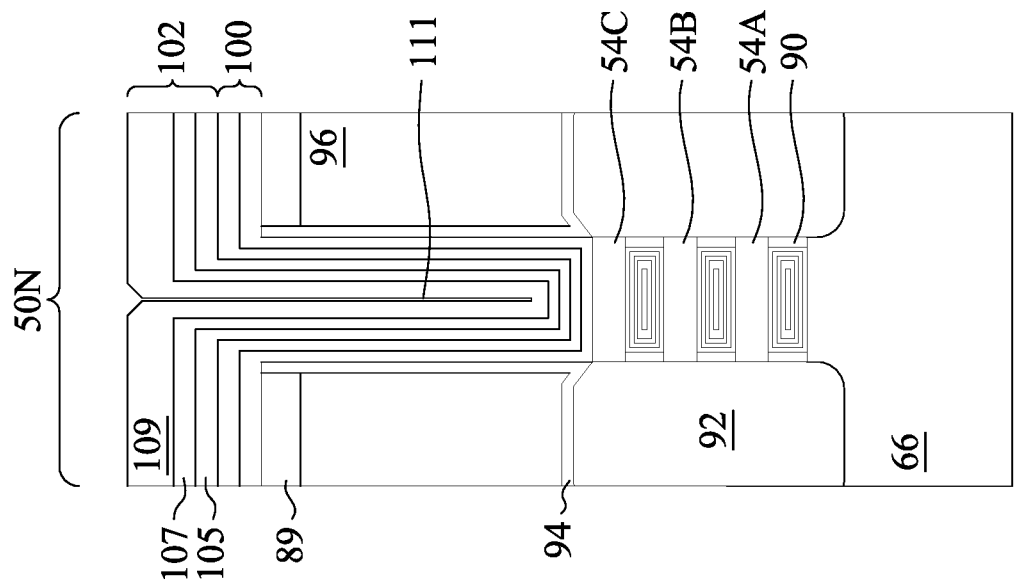

In FIGS. 12-13, the gate electrodes are deposited over the gate dielectric layers 100 and may include multiple layers selected and deposited according to the desired work function of the resulting gate. A fill portion of the gate electrodes may then be deposited to fill the remaining portions of the second recesses 98. The gate electrodes may include metal gate 105 including a metal-containing material such as titanium nitride, titanium oxide, tantalum nitride, tantalum carbide, cobalt, ruthenium, aluminum, tungsten, combinations thereof, or multi-layers thereof. Although single layer metal gates 105 are illustrated in FIG. 12, the metal gate 105 may include any number of liner layers and any number of work function tuning layers. Any combination of the layers which make up the metal gate 105 may be deposited in the n-type region 50N between adjacent ones of the second nanostructures 54 and between the second nanostructure 54A and the substrate 50, and may be deposited in the p-type region 50P between adjacent ones of the first nanostructures 52.

For example, in one embodiment, the metal gate 105 may include one or more layers of silicon oxide, hafnium oxide, lanthanum oxide, aluminum oxide, titanium nitride, tantalum nitride, titanium silicon nitride, tungsten carbonitride, tungsten nitride, titanium aluminum nitride, molybdenum nitride, titanium aluminum carbide, titanium aluminide, the like, or combinations thereof.

In some embodiments, the metal gate 105 may merge together around the second nanostructures 54 in the n-type region 50N and around the first nanostructures 52 in the p-type region 50P, while in other embodiments, additional room may remain after depositing the metal gate 105 for subsequently formed layers.

Following formation of the metal gate 105, an adhesion layer 107 (which may also be referred to as a "glue layer") may be conformally deposited in the second recesses 98 to provide adhesion for a subsequently deposited metal fill 109. The adhesion layer 107 is deposited conformally over the metal gate 105. In some embodiments, the adhesion layer 107 includes titanium nitride, tantalum nitride, or the like. The adhesion layer 107 may be deposited by molecular-beam deposition (MBD), ALD, PECVD, PEALD and the like at a temperature between 200° C. and 500° C. For example, if titanium nitride is deposited using an ALD process, cycles of $TiCl_4$ and $NH_3$ may be used to build up ALD deposited layers. If titanium nitride is deposited using a PEALD process, cycles of tetrakis (dimethylamino) titanium (TDMAT) and $NH_3$ may be used to build up PEALD deposited layers. The resulting thickness of the adhesion layer 107 may be between about 5 Å and 15 Å. In some embodiments, the adhesion layer 107 may merge together around the second nanostructures 54 in the n-type region 50N and around the first nanostructures 52 in the p-type region 50P, while in other embodiments, additional room may remain after depositing the adhesion layer 107 for subsequently formed layers.

In FIG. 13, a metal fill 109 is deposited as the remaining portions of the gate electrodes 102 (including the metal gates 105, the adhesive layer 107 and metal fill 109) to fill the remaining portions of the second recesses 98. The metal fill 109 may be deposited over the adhesion layer 107. In some embodiments, the metal fill 109 includes tungsten, molybdenum cobalt, ruthenium, aluminum, combinations thereof, or the like, which is deposited by CVD, ALD, PECVD, PEALD, or the like. Due to the conformal deposition of the metal fill 109 and the high aspect ratio of the second recesses 98, a vertical seam 111 may be formed in the metal fill 109, the vertical seam 111 running from the upper surface of the metal fill 109 to a lower point of the vertical seam 111, where the lower point does not carry completely through the metal fill 109, but terminates at a point interposed between the bottom surface of the metal fill 109 and the upper surface of the metal fill 109. The vertical seam 111 can be observed by several defining characteristics. In some embodiments, the vertical seam 111 may include small voids in the metal fill 109 of up to about 10 Å in width (i.e., between 0 Å and 10 Å), which may run continuously or intermittently along the length of the vertical seam 111. Another characteristic of the vertical seam 111 is that the vertical seam 111 has a lower density than other portions of the metal fill 109. Indeed, even if no voids are formed, the vertical seam 111 would still have a lower density than the other parts of the metal fill 109, which have a substantially uniform density. Yet another characteristic of the vertical seam 111 is an interruption in the uniformity of the structure of the metal fill 109. As further described below, the metal fill 109 may be formed by a conformal deposition process which produces a particular structure along each exposed surface. As the metal fill 109 is built up, the right surface in the second recesses 98 approaches the left surface of the second recesses 98. When they meet, the structure is different, resulting in the vertical seam 111. For example, if the deposition processes utilizes an ALD-type processes, deposition cycles are used to form multiple thin layers that each cross-link with each other during deposition. At the vertical seam 111 of the metal fill 109, however, the amount of cross-linking will be measurably less than the crosslinking between deposition layers. For example, the amount of cross-linking may be between 40% and 80% less than the cross-linking of the other layers. It should be noted that the vertical seam 111 may be observed using techniques known to a person of ordinary skill.

The metal fill 109 may be deposited using any suitable process, such as by CVD, ALD, PECVD, or PEALD, though other processes may be used. For example, if using ALD to deposit tungsten, the metal fill 109 may be deposited using $WF_6$ as a precursor gas and $B_2H_6$ or $SiH_4$ (with $H_2$) as a reaction gas to provide a reaction producing a tungsten deposition and $BF_3$ or $SiHF_6$ and HF as byproducts. The process can be performed by providing alternating pulses of the precursor gas and the reactant gas to the deposition site interspersed with purge pulses using argon gas. The process temp may be between about 275° C. and 300° C. and the process pressure may be between about 5 torr and 30 torr. Each layer of tungsten deposited may cross-link with the previous layer, producing a crystalline structure.

The formation of the gate dielectric layers 100 in the n-type region 50N and the p-type region 50P may occur simultaneously such that the gate dielectric layers 100 in each region are formed from the same materials, and the formation of the gate electrodes 102 (including the metal gates 105, the adhesive layer 107 and metal fill 109) may occur simultaneously such that the gate electrodes in each region are formed from the same materials. In some embodiments, the gate dielectric layers 100 in each region may be formed by distinct processes, such that the gate dielectric layers 100 may be different materials and/or have a different number of layers, and/or the gate electrodes in each region may be formed by distinct processes, such that the gate electrodes may be different materials and/or have a different number of layers. Various masking steps may be used to mask and expose appropriate regions when using distinct processes.

Following deposition of the gate dielectric layers 100 and the gate electrodes 102, a chemical index of the gate structure may include tungsten, boron, silicon, fluorine, and chlorine in a stacked concentration from the metal fill 109 to the gate dielectric 101.

Figure 14:
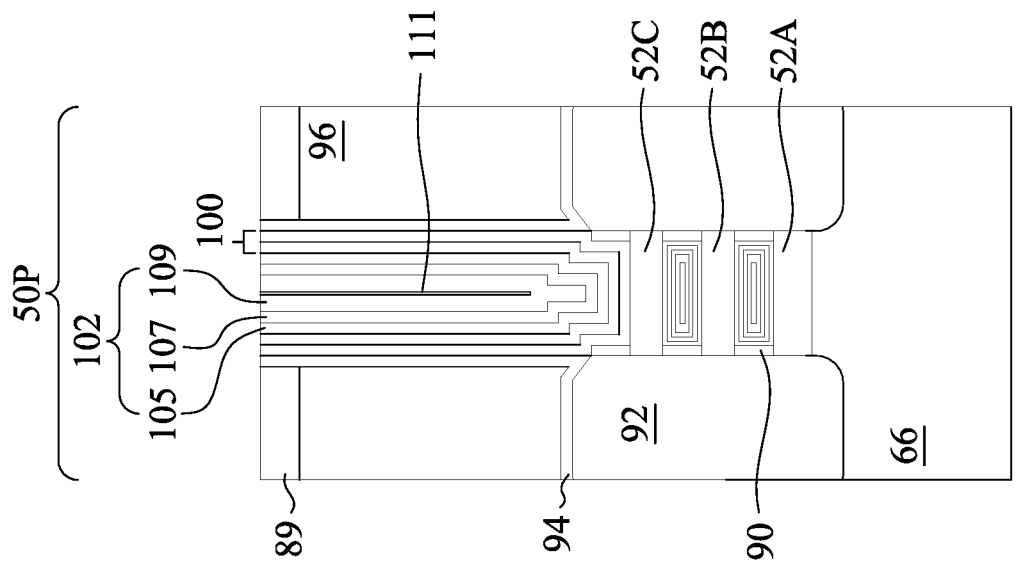
Figure 14:
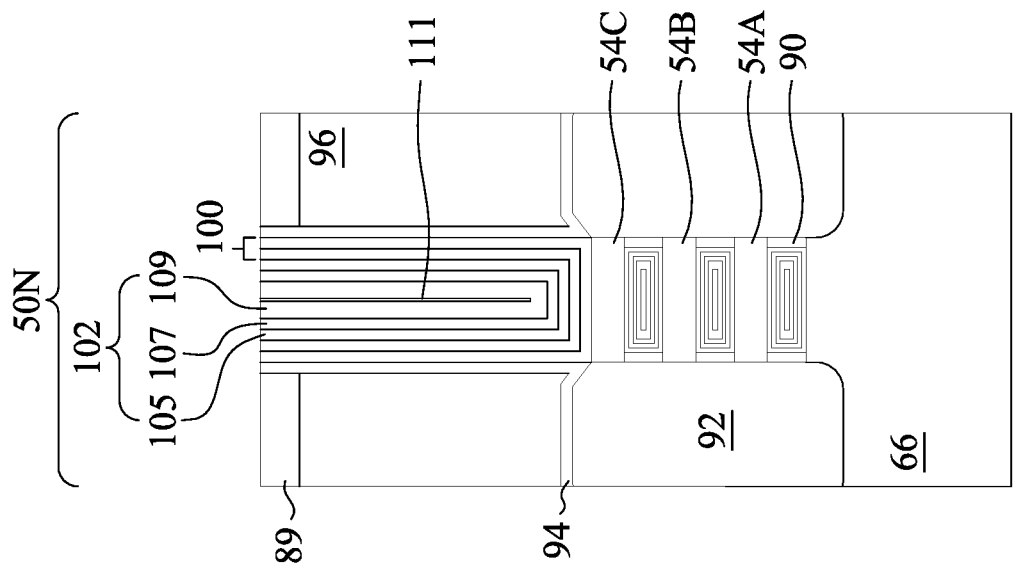

In FIG. 14, after the filling of the second recesses 98, a planarization process, such as a CMP, may be performed to remove the excess portions of the gate dielectric layers 100 and the material of the gate electrodes (including the metal gates 105, the adhesive layer 107 and metal fill 109), which excess portions are over the top surface of the self-align mask 89. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 15A:
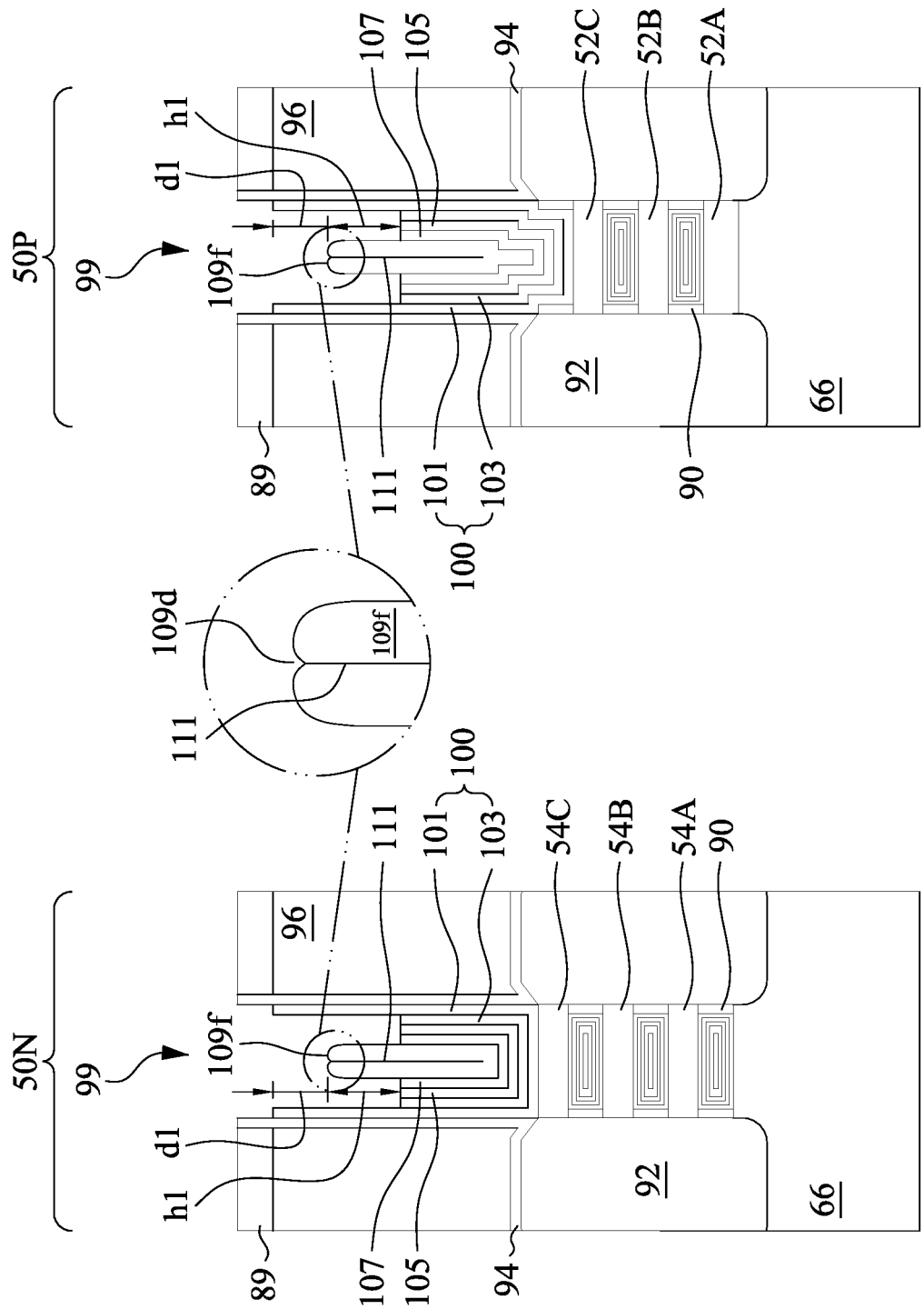
Figure 15B:
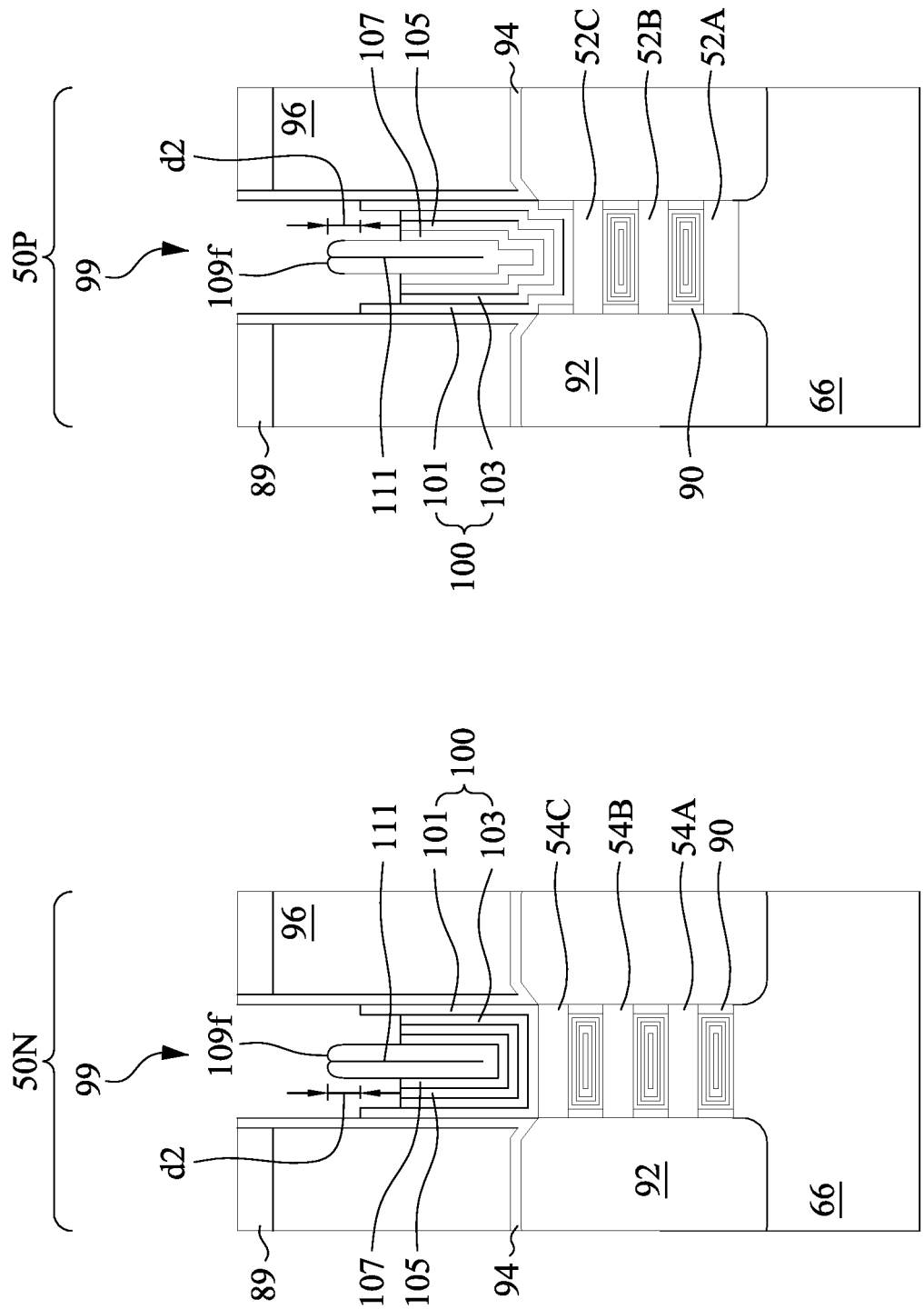

In FIGS. 15A and 15B, the gate structure (including the gate dielectric layers 100 and the corresponding overlying gate electrodes 102) is recessed by a selective etching process, so that third recesses 99 are formed directly over the gate structure and between opposing portions of CESL 94. The selective etching process can be used to leave a fin-shaped portion of the metal fill 109, a fin electrode 109f, protruding upward into the third recesses 99. The fin electrode 109f may be used to provide reduced sizing for contacts to the gate structures and to the source/drain regions. The fin electrode 109f also provides for a reduced gate resistance by increasing the contact points for the gate contacts. This results in a performance improvement, even as gate sizes are continually decreasing.

The materials of the first gate dielectric 101, second gate dielectric 103, metal gate 105, adhesive layer 107, and metal fill 109 may each have different etch selectivities to different etchants. The third recesses 99 may be made by applying a suitable etchant to the replacement gate structure. The etchants may be applied using a wet or dry etching process and may be applied in any order. In some embodiments, multiple etchants may be used simultaneously. The process variables may be adjusted to achieve a desired outcome as far as etch depth and etch selectivity. Although each of the second gate dielectric 103, metal gate 105, and adhesive layer 107 are illustrated as being etched to the same depth in the third recesses 99, it should be understood that they may each have different etch depths. In some embodiments, the etching of each of the first gate dielectric 101, second gate dielectric 103, metal gate 105, adhesive layer 107, and metal fill 109, may be performed for a duration between 1 sec and 300 sec and at a process temperature between about 50° C. and about 120° C. The etching may be done in multiple etching and optional cleaning cycles using RF power assisted etching techniques to energize the suitable etchants.

For example, the first gate dielectric 101 can be etched by an HF containing etchant, the second gate dielectric layer 103 can be etched by a Cl containing etchant such as such as $BCl_3$ and $CH_4$, and the metal gate 105 and adhesive layer 107 can be etched by $Cl_2$, $BCl_3$, $O_2$, $CF_4$, or $N_2$ etchants. It should be understood that these are just examples and can be changed based on the material compositions of each of the layers. In some embodiments, the metal fill 109 can be etched by etchants including $N_2$, $NF_3$, $O_2$, $BCl_3$, and $Cl_2$ or $Cl_2$ and $O_2$. The metal fill 109 may be etched in a separate process to form the fin electrode 109f. In other embodiments, a separate etching process is not needed to etch the fin electrode 109f. In such embodiments, some slight etching that may occur from one or more of each of the etching processes to etch the first gate dielectric 101, second gate dielectric 103, metal gate 105, and adhesive layer 107, may cause some recessing and etching to occur to the metal fill 109, at a lower effective etch rate, resulting in the fin electrode 109f. In either case, the shape of the fin electrode 109f is illustrated as being rounded at the top, but may also be shaped like a rectangle, trapezoid, oval, or diamond, depending on the etch conditions and etching order. As illustrated in FIG. 15A in the circular call-out, the top of the fin electrode 109f may have a depression 109d centered on the vertical seam 111, forming an m-shape in cross-sectional view. A similar depression 109d may also be observed for any of the aforementioned shapes as well as for the variation discussed below with respect to FIG. 15B.

In FIG. 15A, the first gate dielectric 101 is illustrated as extending vertically further than the fin electrode 109f after the etching processes are complete. The first gate dielectric 101 extends above the vertical extent of the fin electrode 109f by a distance d1. In FIG. 15B, the first gate dielectric 101 is illustrated as not extending vertically as far as the fin electrode 109f by a distance d2. The distances d1 and d2 may each be between about 0 nm and about 20 nm. In other words, the height of the first gate dielectric 101 may vary in relation to the height of the fin electrode 109f to be in a range that is the distance d2 lower all the way to a distance d1 higher than the height of the fin electrode 109f. The height h1 of the fin electrode 109f protruding from (i.e., free from) the adhesion layer 107 and/or the metal gate 105 may be between about 0 nm and 8 nm. When the first gate dielectric 101 is higher than the fin electrode 109f, such as illustrated in FIG. 15A, the chances of unintentionally shorting the subsequently formed source/drain contact to the subsequently formed gate contact is decreased, however, the gapfill window is also decreased (e.g., for depositing the subsequently formed gate contact). In contrast, when the first gate dielectric 101 is lower than the fin electrode 109f, the gapfill window is increased, but the chances of unintentionally shorting the source/drain to the gate is increased. As such, these parameters can be adjusted to suit the design tolerances of the device.

Figure 16:
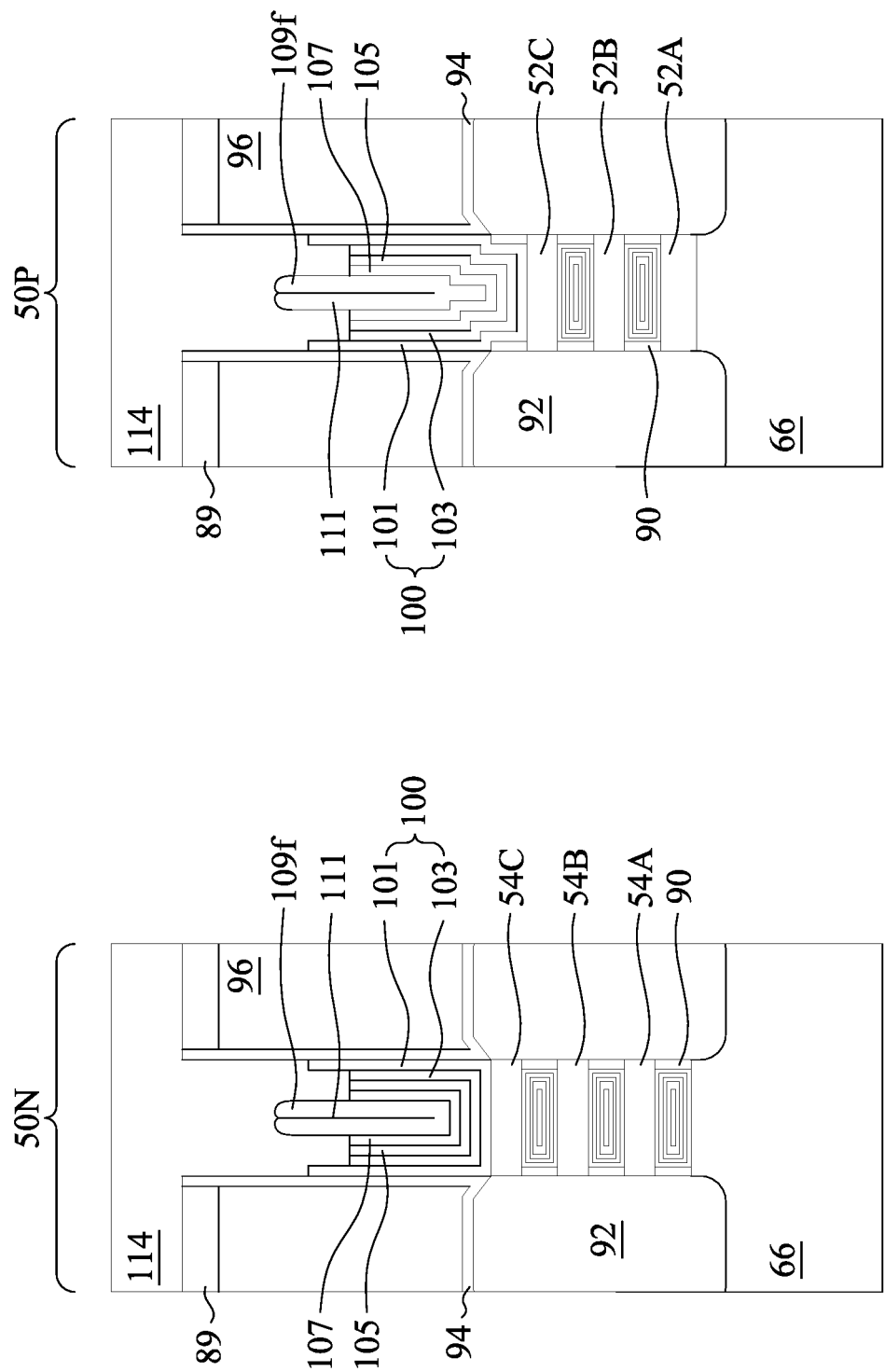

In FIG. 16, a gate mask 114 comprising one or more layers of dielectric material, such as silicon nitride, silicon oxynitride, or the like, is filled in the third recesses 99. The gate mask 114 may be formed using materials and processes similar to those used to form the self-align mask 89.

Figure 17:
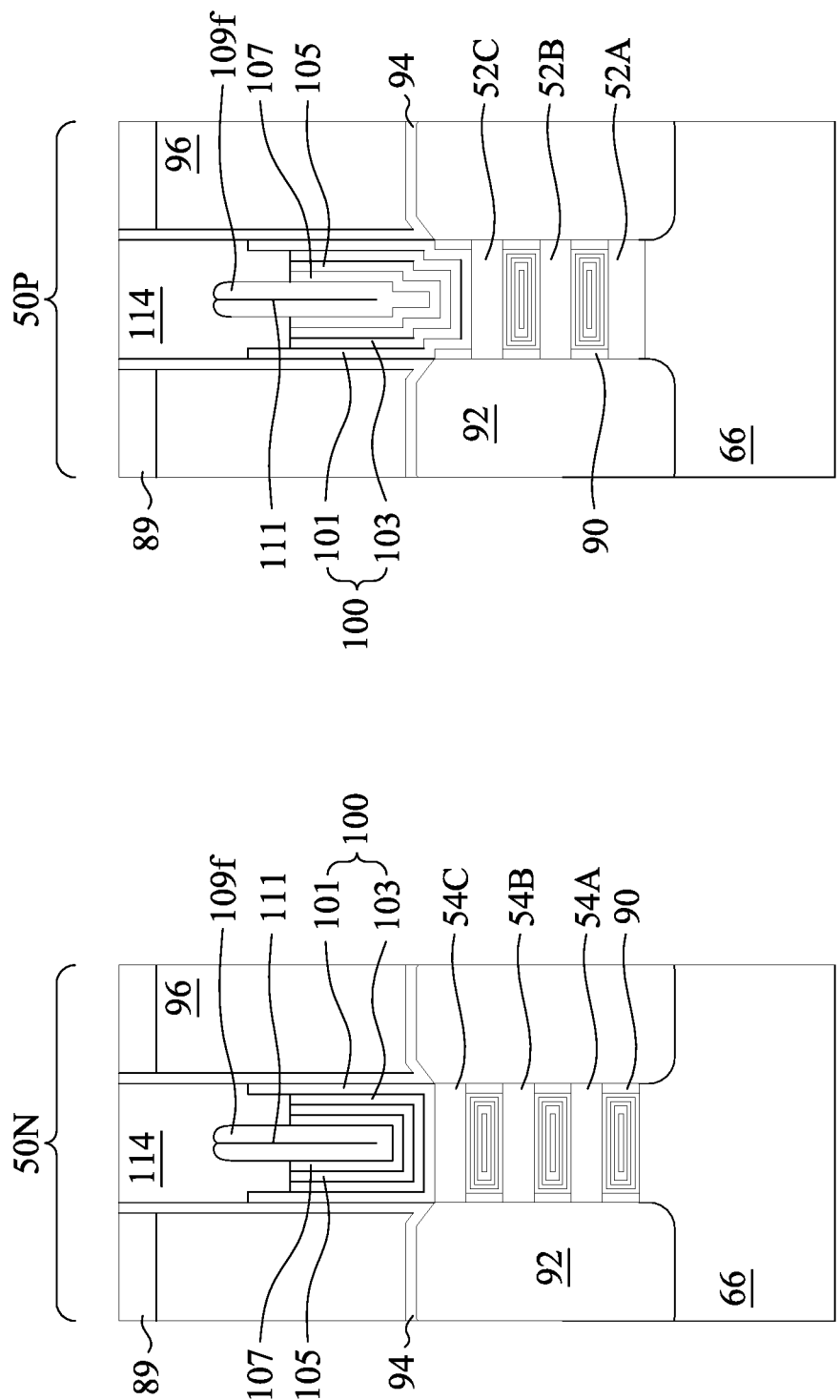

In FIG. 17, a planarization process is used to remove excess portions of the dielectric material of the gate mask 114 extending over the self-align mask 89. Subsequently formed gate contacts (such as the gate contacts 124, discussed below with respect to FIGS. 20A-20D) penetrate through the gate mask 114 to contact the top surface of the recessed gate dielectric layers 100 and gate electrodes 102.

Figure 18A:
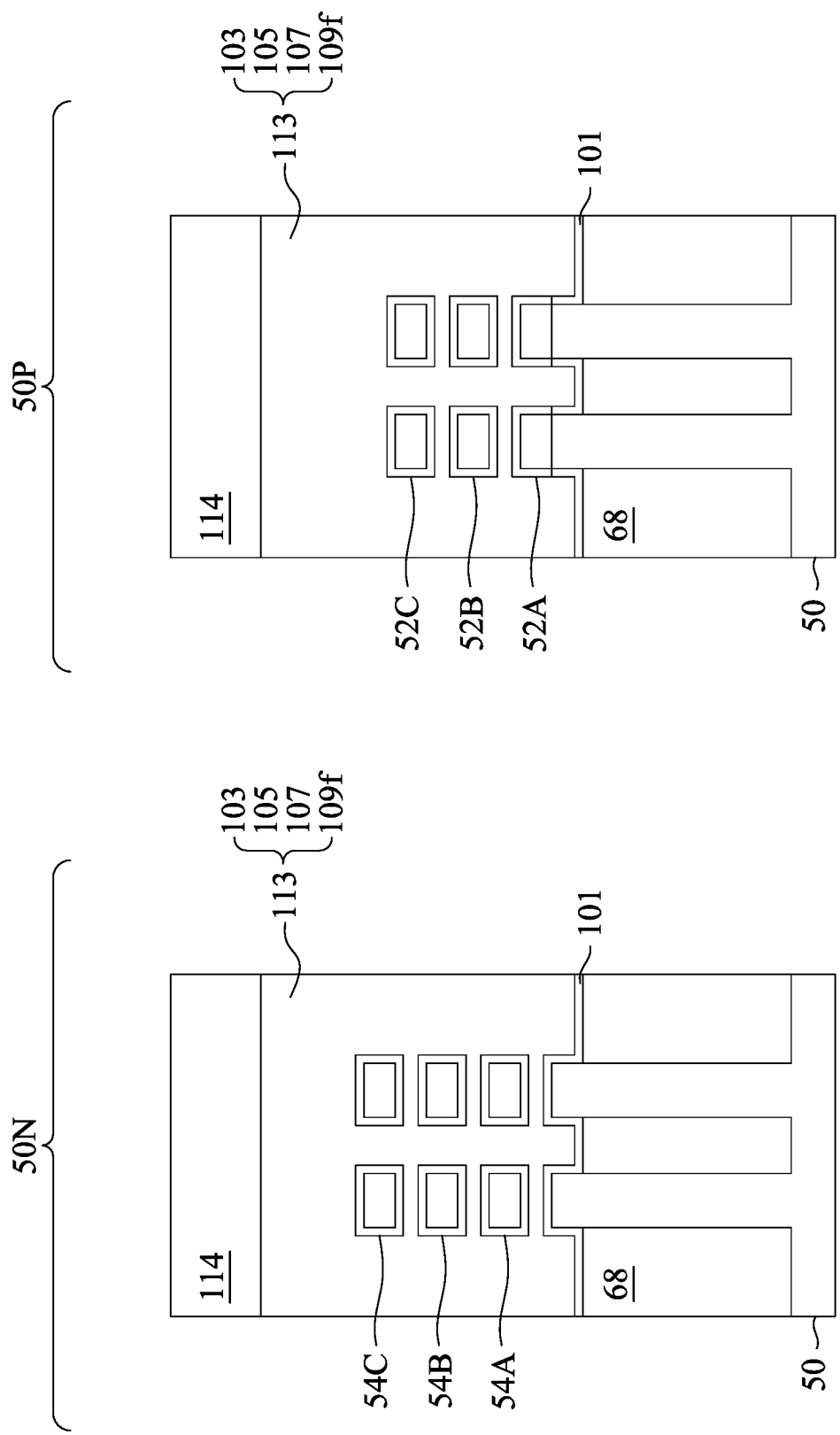
Figure 18B:
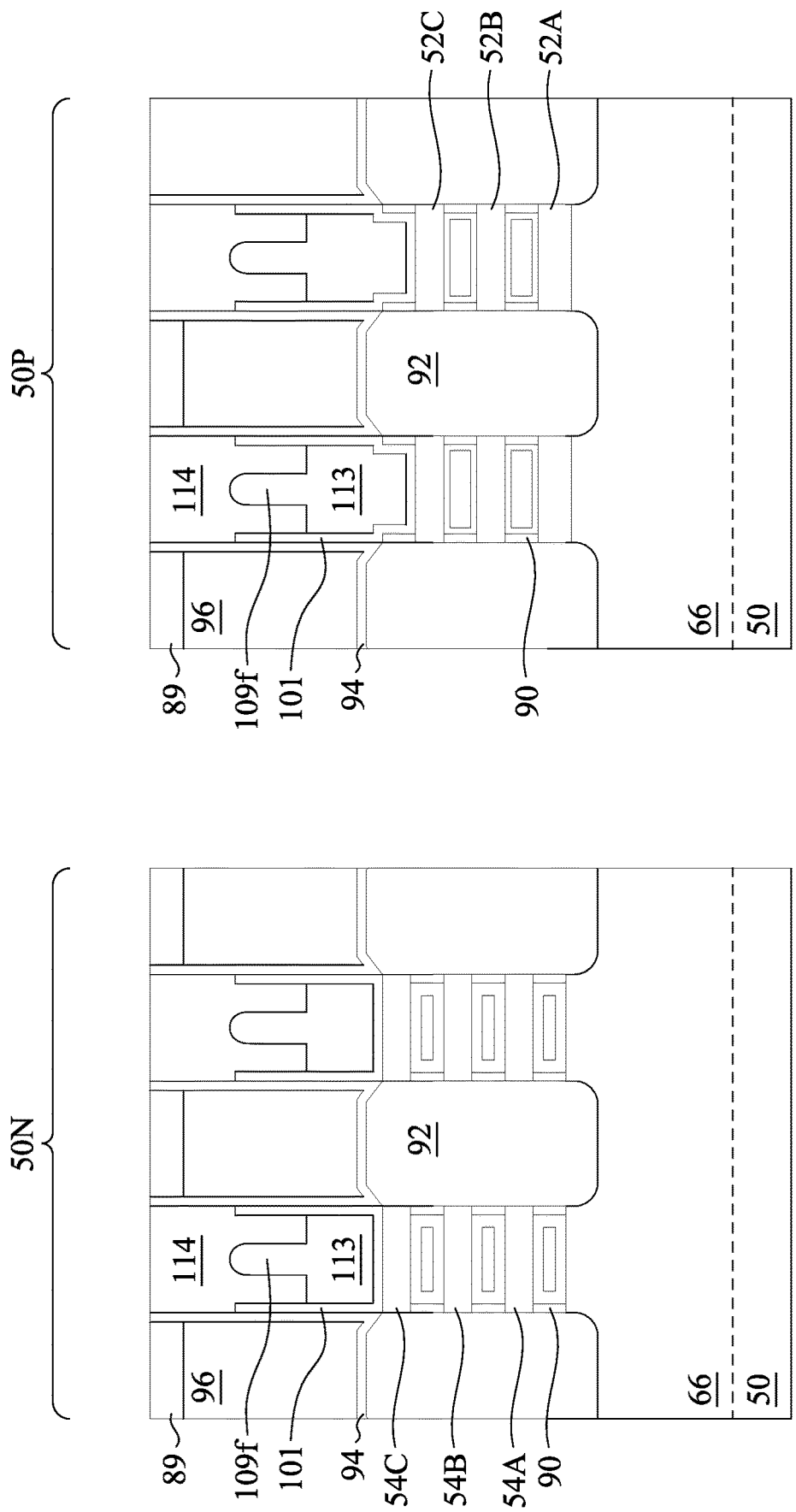
Figure 19A:
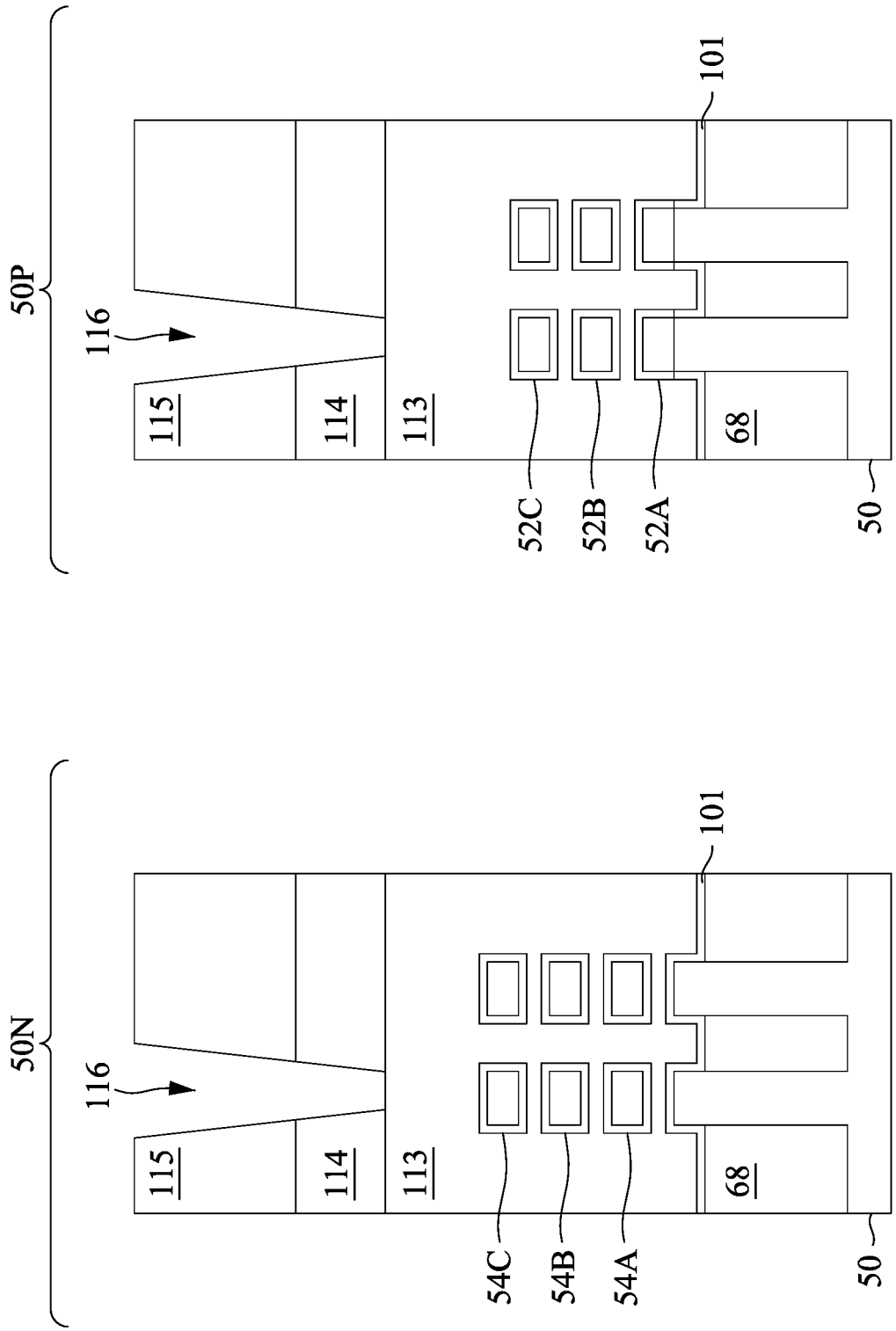
Figure 19B:
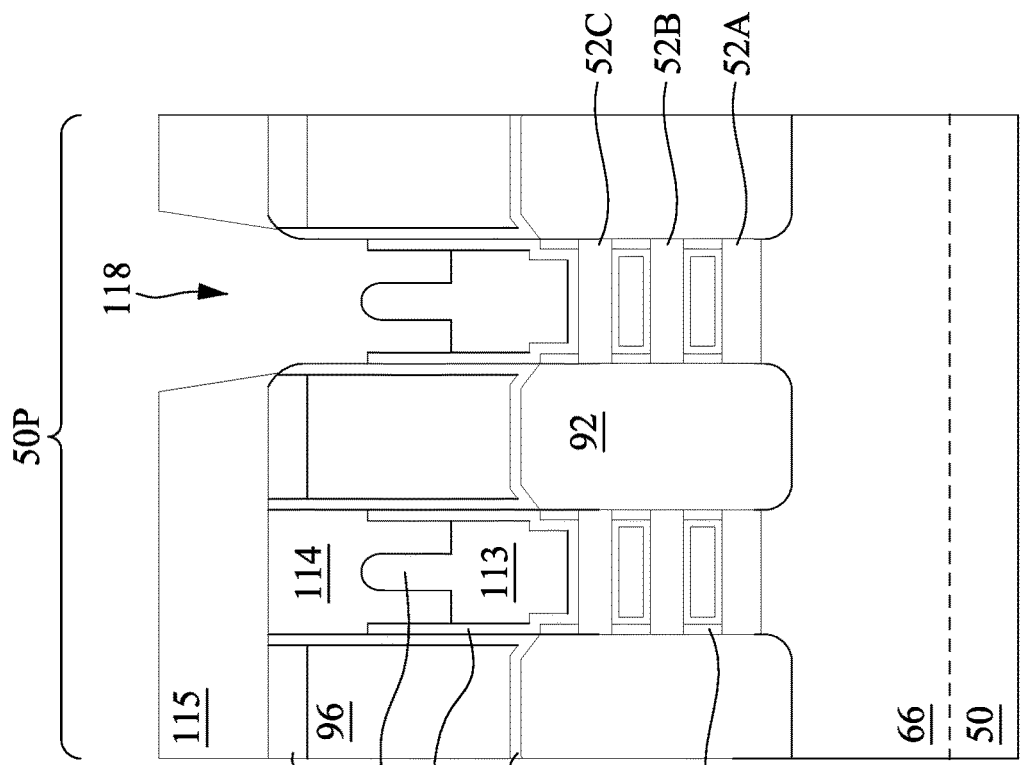
Figure 19B:
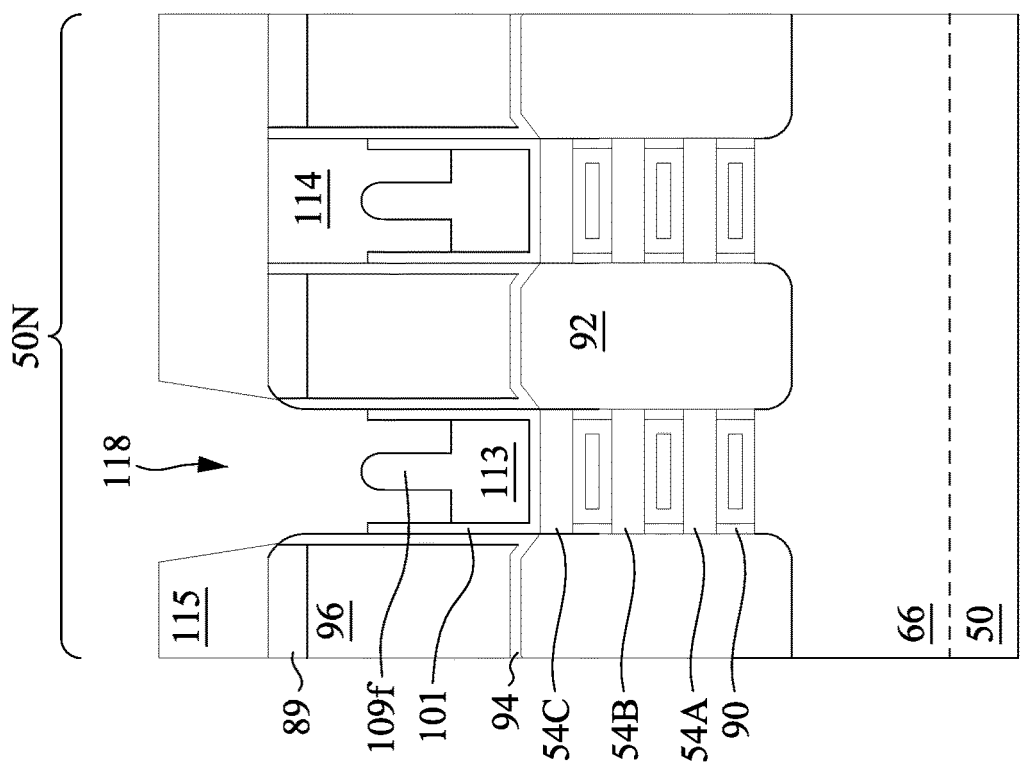
Figure 19C:
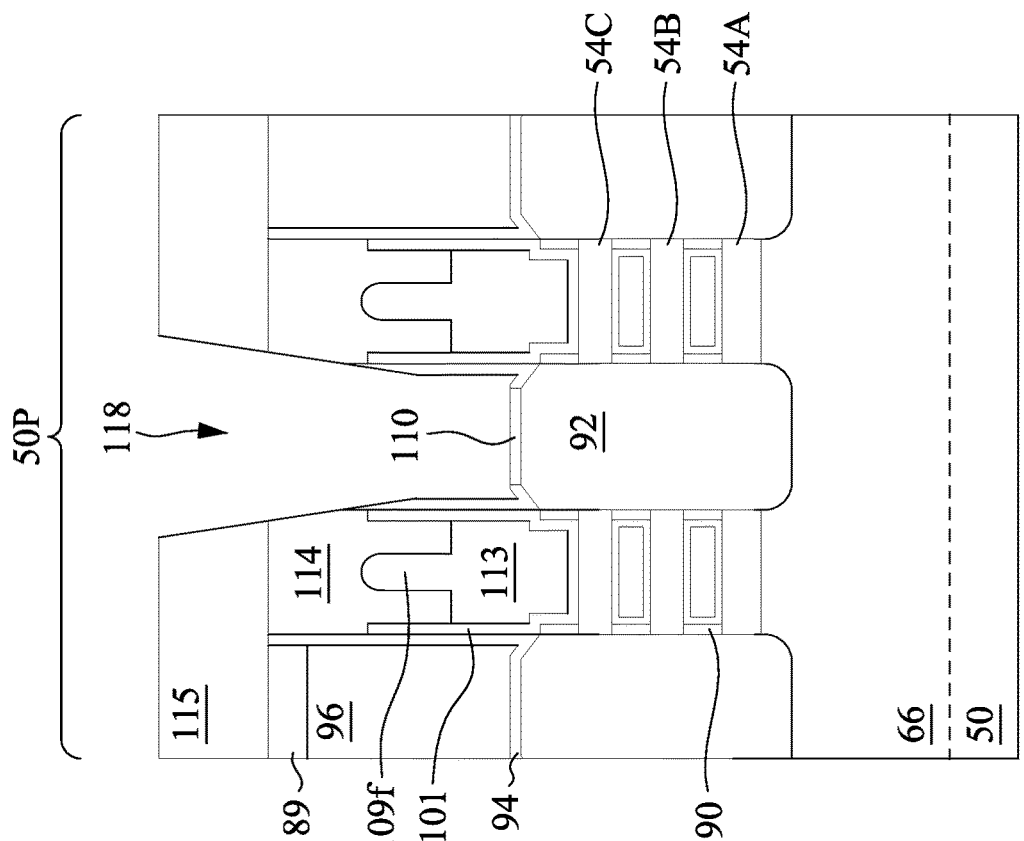
Figure 19C:
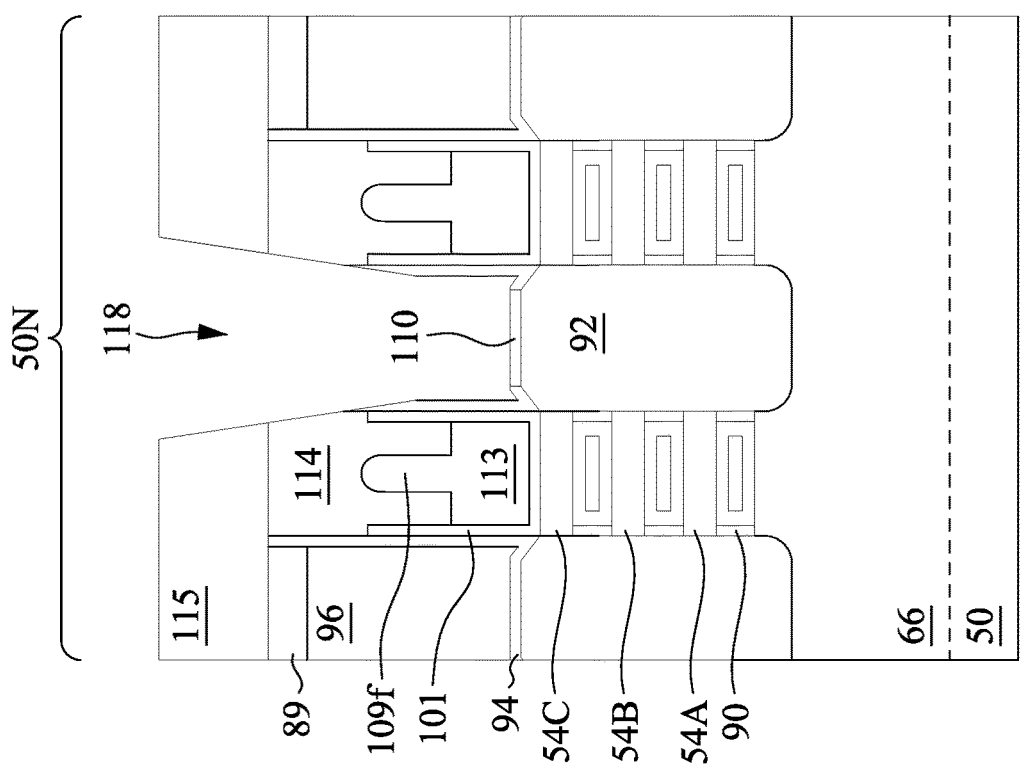
Figure 19D:
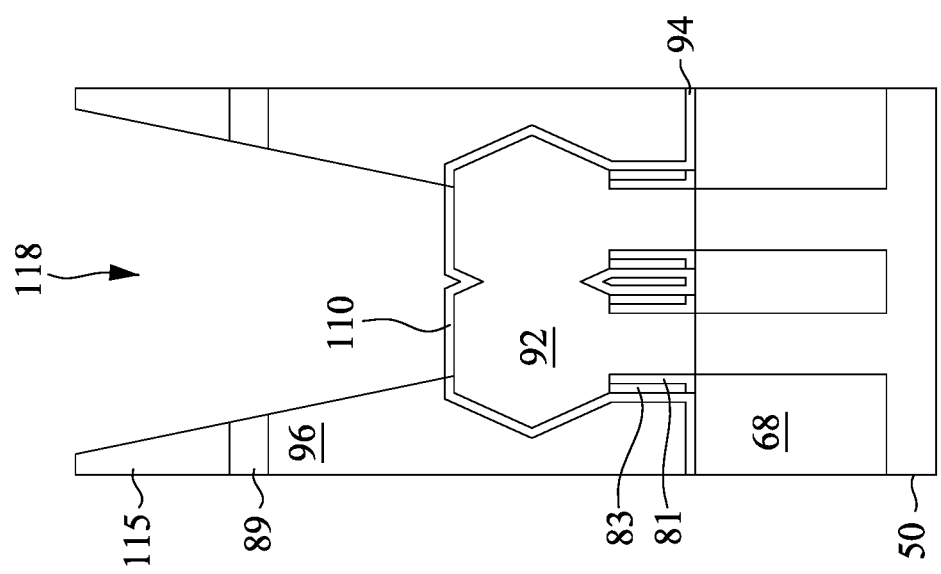
Figure 20A:
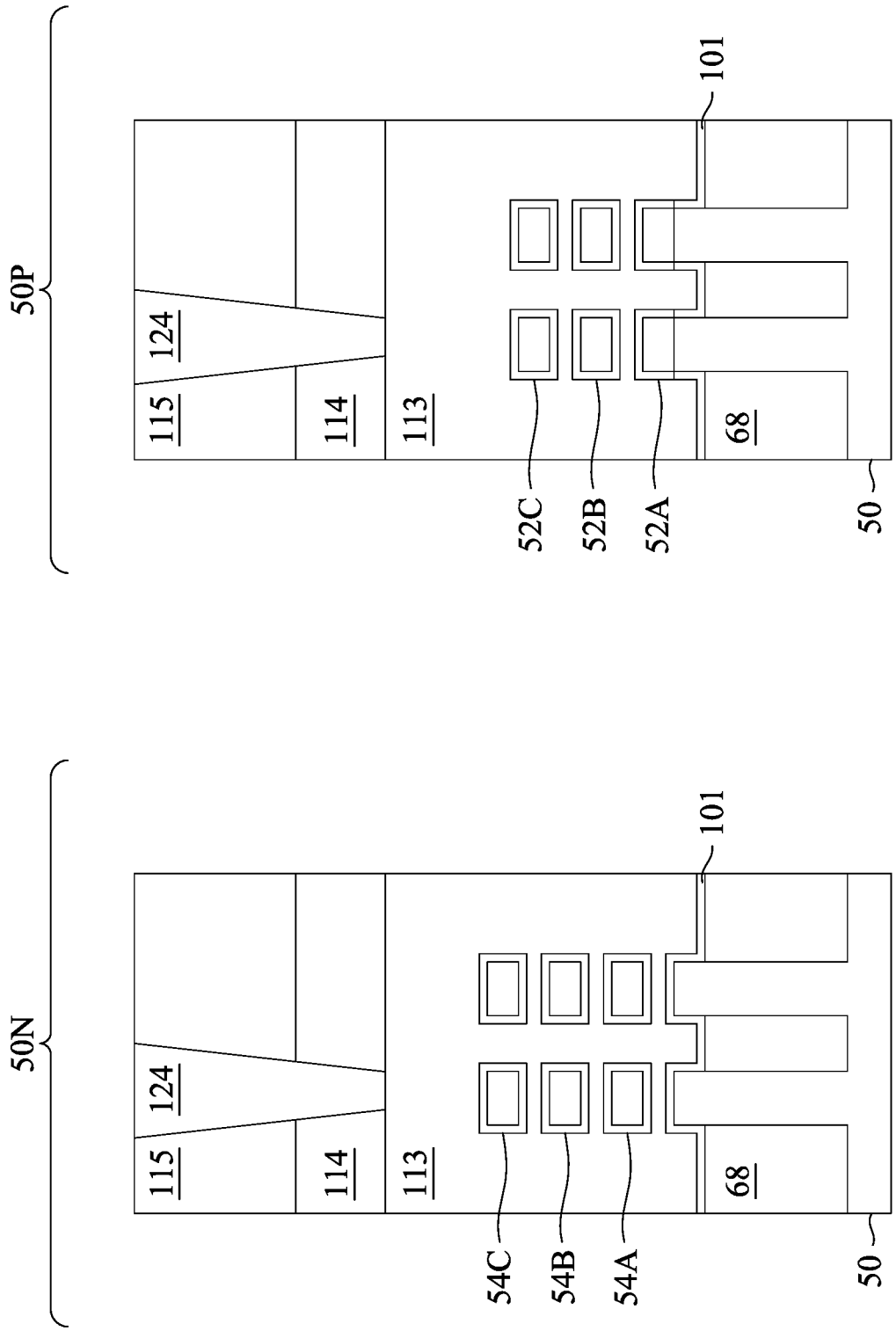
Figure 20B:
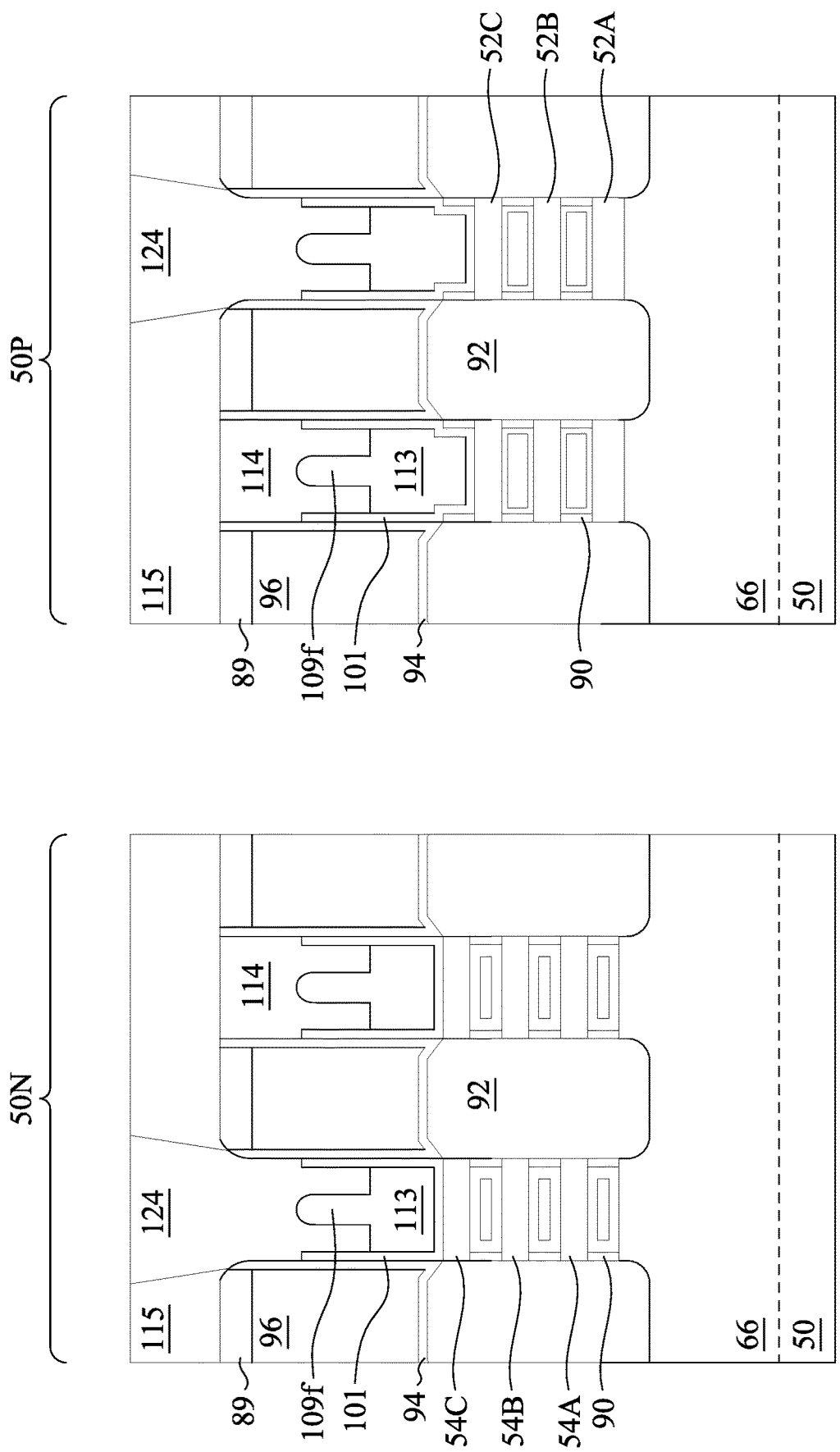
Figure 20C:
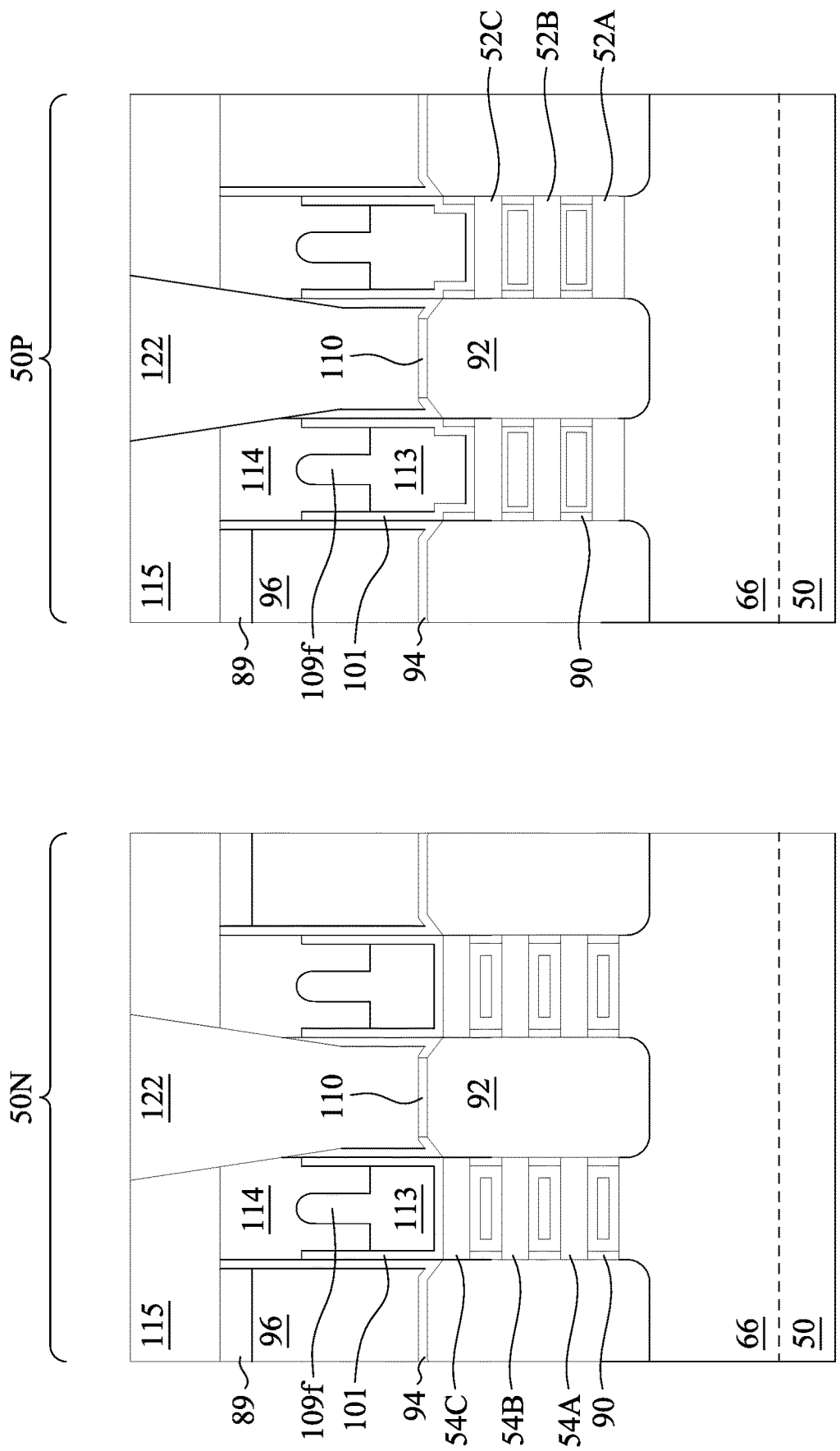
Figure 20D:
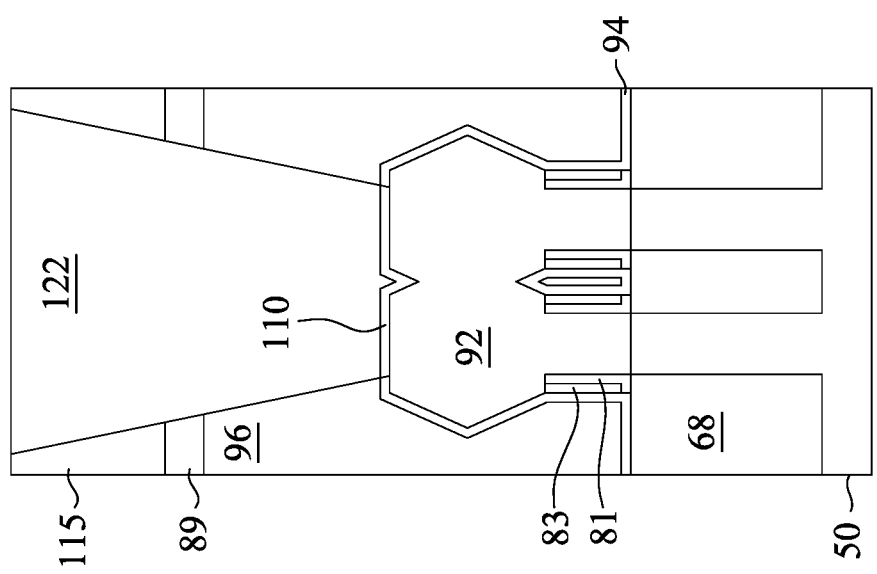

FIGS. 18A-18C, 19A-19D, and 20A-20C return to the previous views (such as illustrated in FIGS. 10A-10B), after the processes illustrated in FIGS. 11 through 17 have been performed. In FIGS. 18A-18C, 19A-19D, and 20A-20C, the first gate dielectric 101 is illustrated as a distinctive layer, but the second gate dielectric 103, the metal gate 105, the adhesive layer 107, and the fin electrode 109f have been combined into a single gate structure 113. FIGS. 18A-18C illustrate a widened views of the structure of FIG. 17 in a variety of cross-sections.

In FIGS. 19A-19D, a second ILD 115 is deposited over the self-align mask 89 and over the gate mask 114. In some embodiments, the second ILD 115 is a flowable film formed by FCVD. In some embodiments, the second ILD 115 is formed of a dielectric material such as PSG, BSG, BPSG, USG, or the like, and may be deposited by any suitable method, such as CVD, PECVD, or the like.

In FIGS. 19A-19D, the second ILD 115, the self-align mask 89, the first ILD 96, the CESL 94, and the gate masks 114 are etched to form fourth recesses 118 exposing surfaces of the epitaxial source/drain regions 92 and/or the fin electrode 109f of the gate structure 113. The fourth recesses 118 may be formed by etching using an anisotropic etching process, such as RIE, NBE, or the like. In some embodiments, the fourth recesses 118 may be etched through the second ILD 115 using a first etching process; may be etched through the self-align mask 89 using a second etching process; may be etched through the first ILD 96 using a third etching process; may be etched through the gate masks 114 using a fourth etching process; and may then be etched through the CESL 94 using a fifth etching process. In some embodiments the fourth etching process may be performed at the same time as the second etching process or the third etching process, depending on the materials used for the respective etched materials. A mask, such as a photoresist, may be formed and patterned over the second ILD 115 to mask portions of the second ILD 115 from the first etching process and the second etching process. In some embodiments, the etching process may over-etch, and therefore, the fourth recesses 118 may extend into the epitaxial source/drain regions 92 and/or the gate structure 113, and a bottom of the fourth recesses 118 may be level with (e.g., at a same level, or having a same distance from the substrate), or lower than (e.g., closer to the substrate) the epitaxial source/drain regions 92 and/or the gate structure 113. Although FIGS. 19B and 19C illustrate the fourth recesses 118 as exposing the epitaxial source/drain regions 92 and the gate structure 113 in different cross sections, in various embodiments, a cross-section may include both sets of fourth recesses 118 in the same cross-section.

After the fourth recesses 118 are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Next, in FIGS. 20A-D, contacts 122 and 124 (may also be referred to as contact plugs) are formed in the fourth recesses 118. The contacts 122 and 124 may each comprise one or more layers, such as barrier layers, diffusion layers, and fill materials. For example, in some embodiments, the contacts 122 and 124 each include a barrier layer and a conductive material, and is electrically coupled to the underlying conductive feature (e.g., gate structure 113 and/or silicide region 110 in the illustrated embodiment). The contacts 124 are electrically coupled to the gate structure 113 and wrap over the fin electrode 109f and may be referred to as gate contacts, and the contacts 122 are electrically coupled to the silicide regions 110 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 115.

Figure 21A:
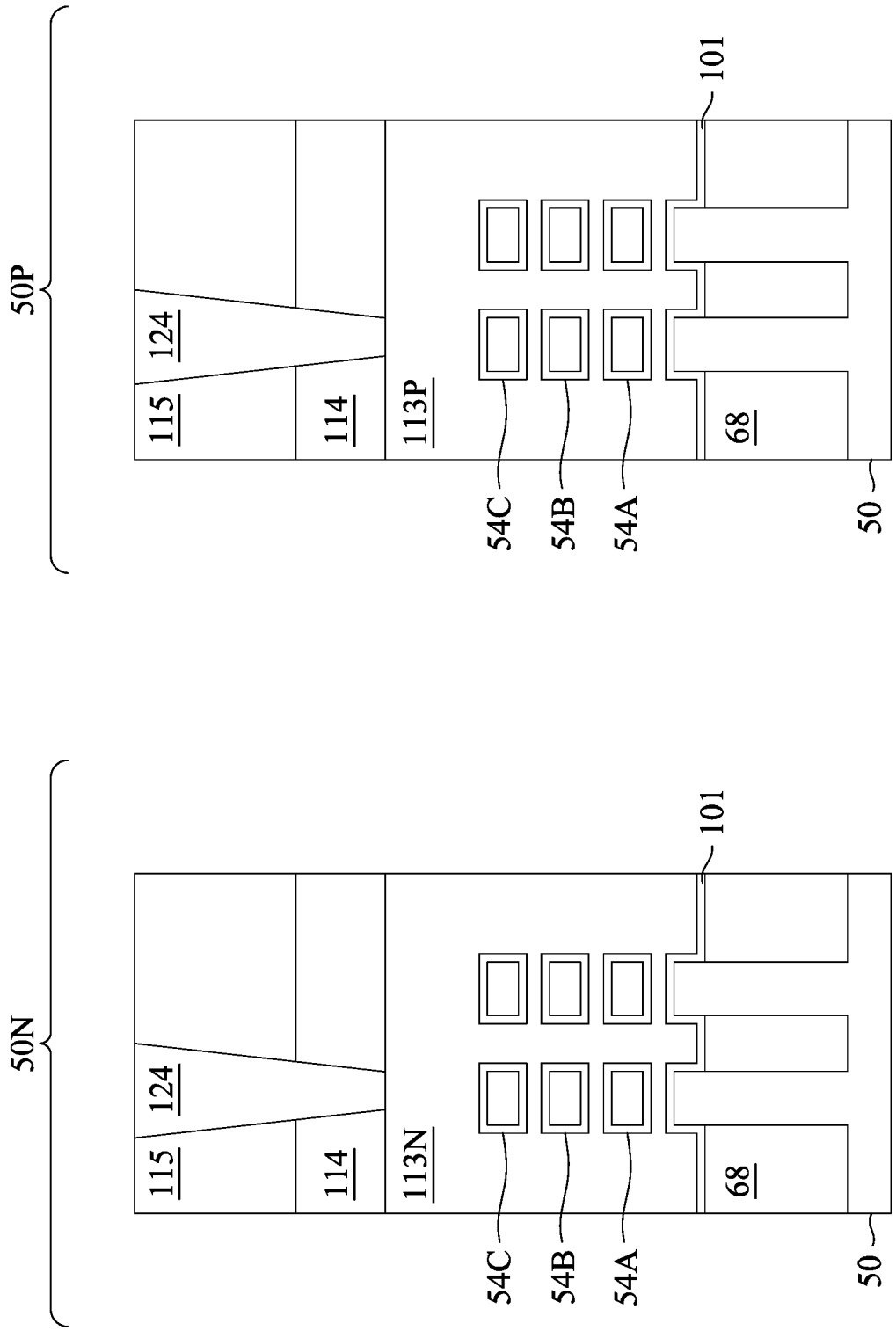
FIGS. 21A, 21B, 21C, and 21D are cross-sectional views of a nano-FET, in accordance with some embodiments.
Figure 21B:
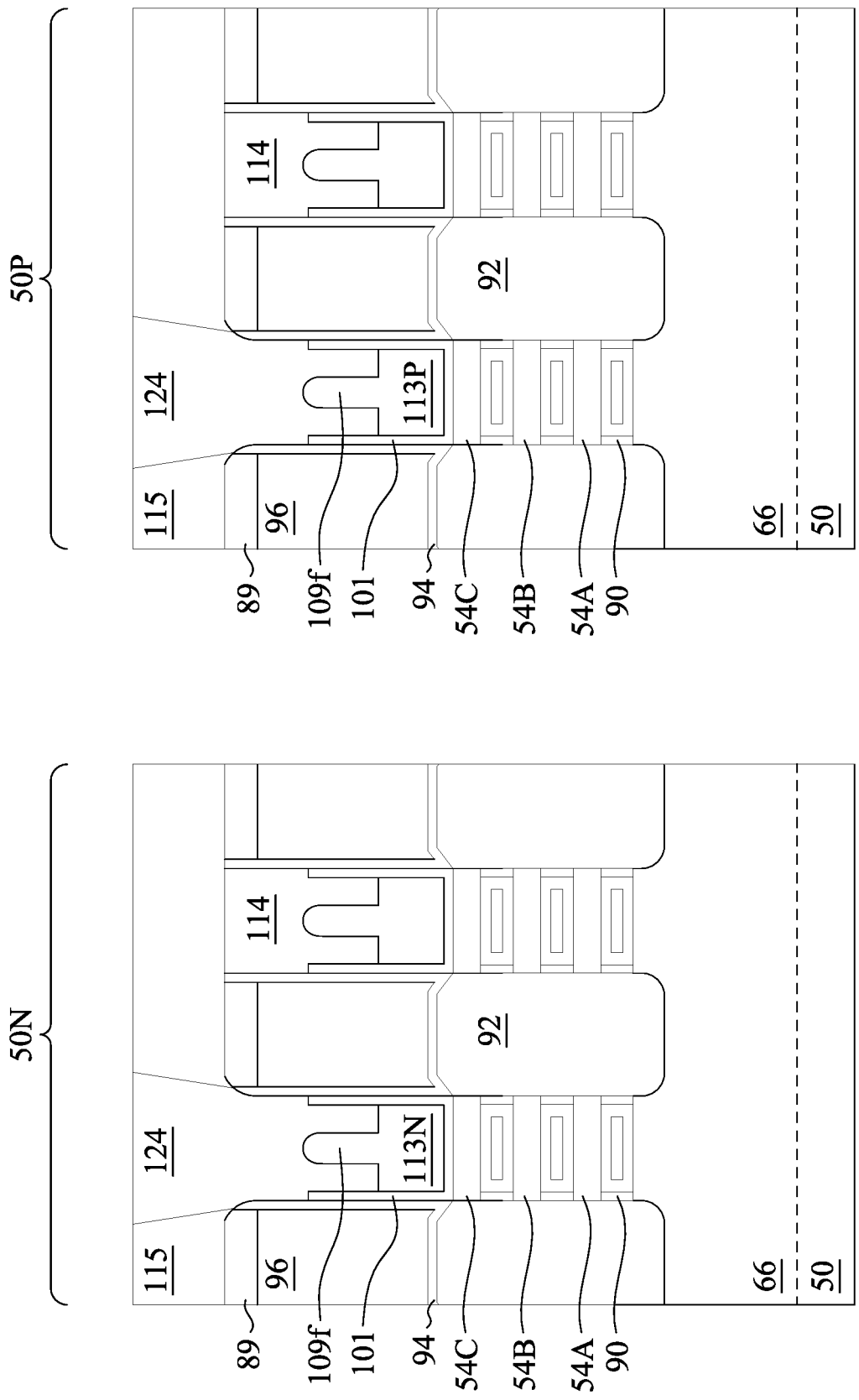
Figure 21C:
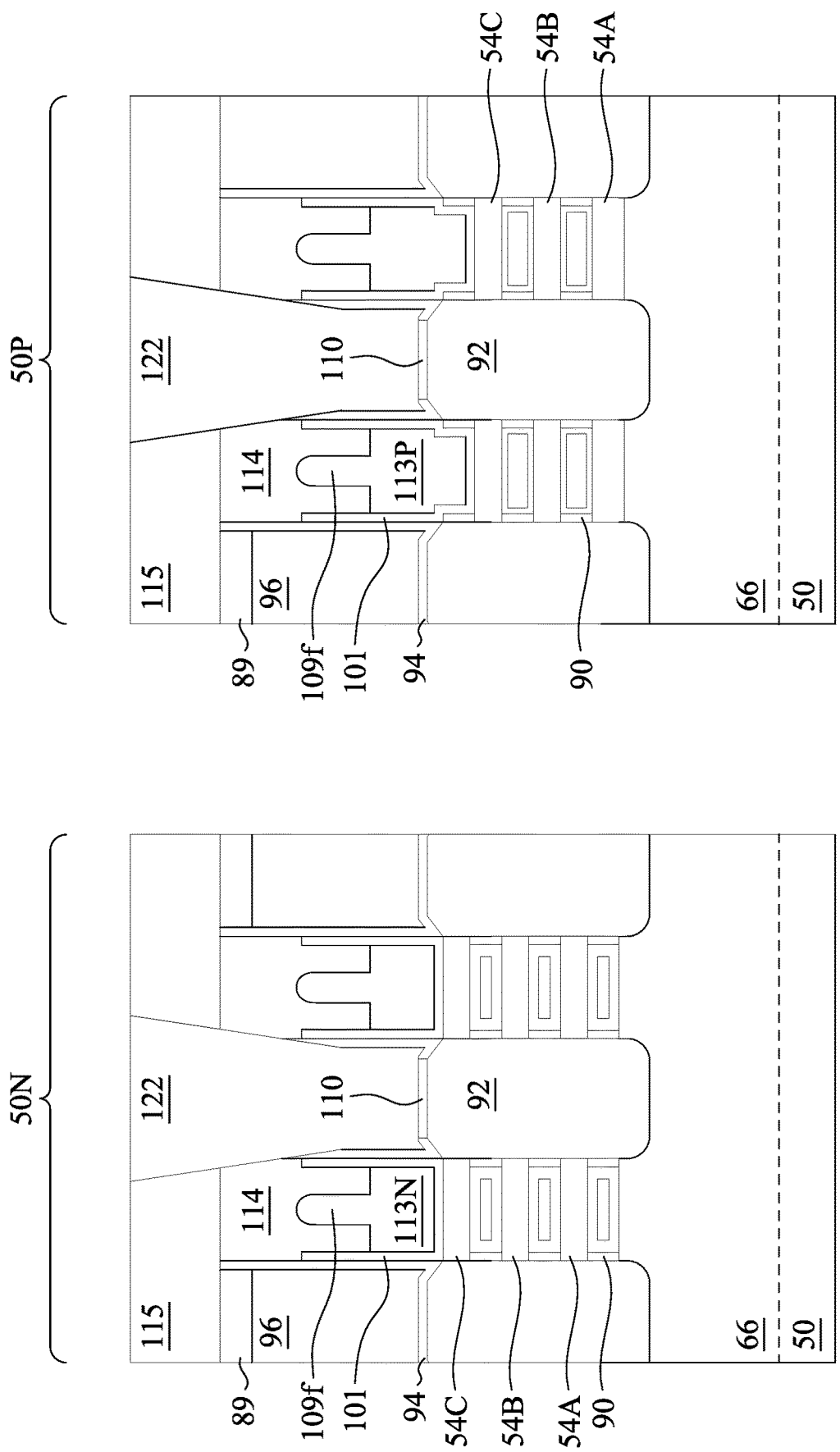
Figure 21D:
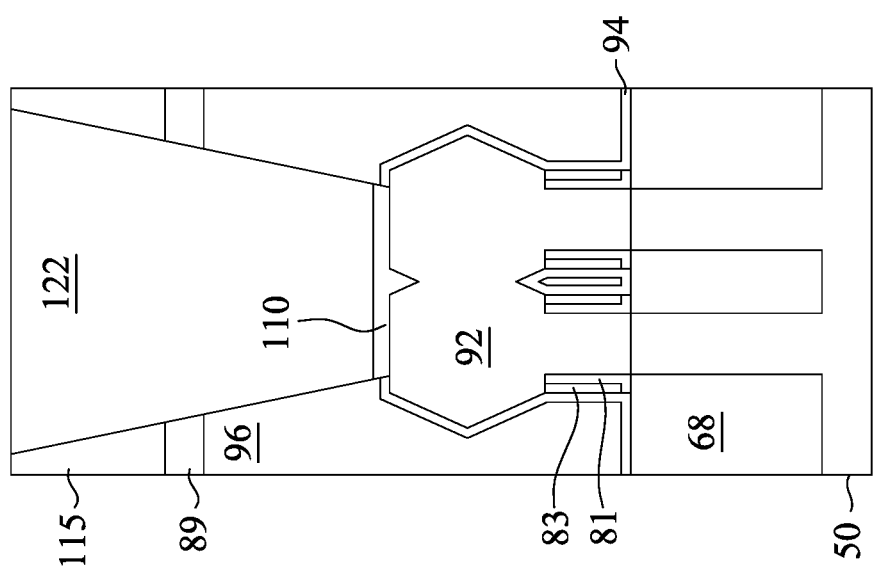

FIGS. 21A-D illustrate cross-sectional views of a device according to some alternative embodiments. FIG. 21A illustrates reference cross-section A-A' illustrated in FIG. 1. FIG. 21B illustrates reference cross-section B-B' illustrated in FIG. 1. FIG. 21C illustrates a cross-section parallel to and also through the fin of the reference cross-section B-B' illustrated in FIG. 1. FIG. 21D illustrates reference cross-section C-C' illustrated in FIG. 1. In FIGS. 21A-D, like reference numerals indicate like elements formed by like processes as the structure of FIGS. 20A-D. However, in FIGS. 21A-D, channel regions in the n-type region 50N and the p-type region 50P comprise a same material. For example, the second nanostructures 54, which comprise silicon, provide channel regions for p-type nano-FETs in the p-type region 50P and for n-type nano-FETs in the n-type region 50N. The structure of FIGS. 21A-D may be formed, for example, by removing the first nanostructures 52 from both the p-type region 50P and the n-type region 50N simultaneously; depositing the gate dielectric layers 100 and the gate electrodes 113P (e.g., gate electrode suitable for a p-type nano-FET) around the second nanostructures 54 in the p-type region 50P; and depositing the gate dielectric layers 100 and the gate electrodes 113N (e.g., a gate electrode suitable for a n-type nano-FET) around the second nanostructures 54 in the n-type region 50N. In such embodiments, materials of the epitaxial source/drain regions 92 may be different in the n-type region 50N compared to the p-type region 50P as explained above.

Figure 22B:
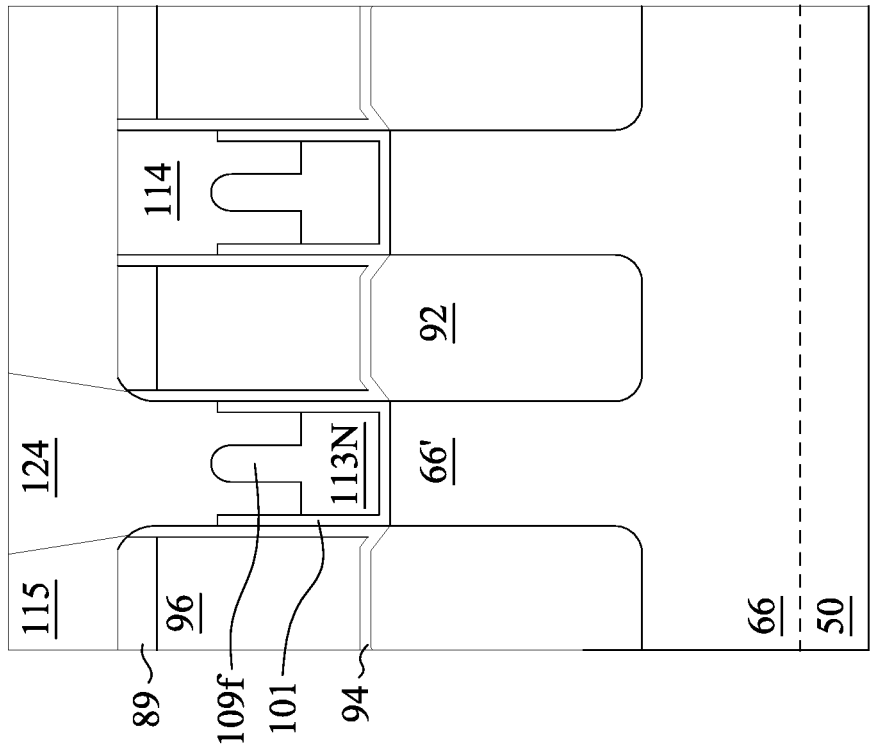
FIGS. 22A, 22B, 22C, and 22D are cross-sectional views of a FinFET, in accordance with some embodiments.
Figure 22A:
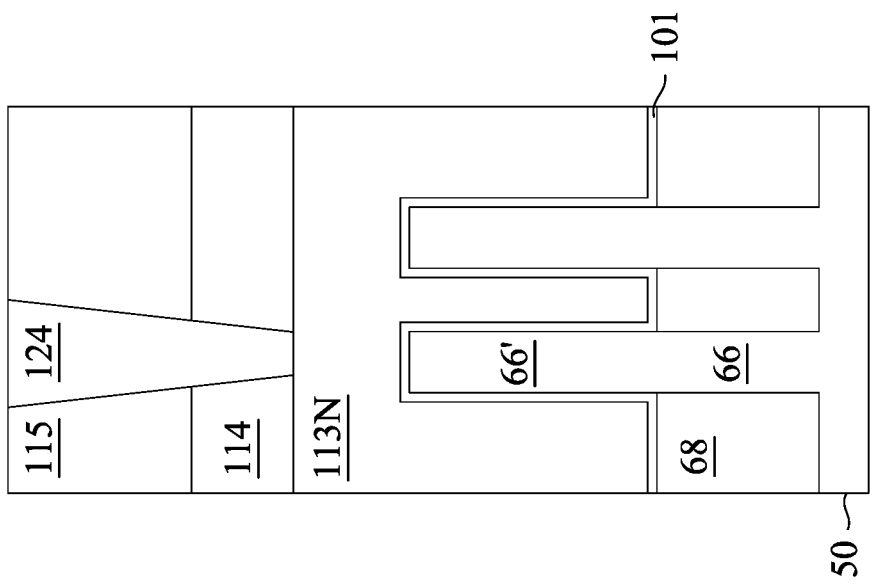
Figure 22D:
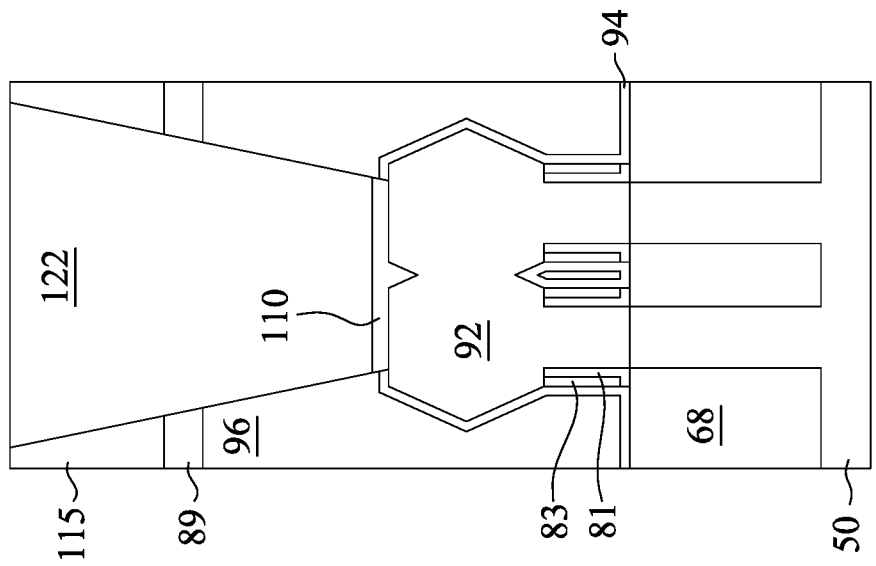
Figure 22C:
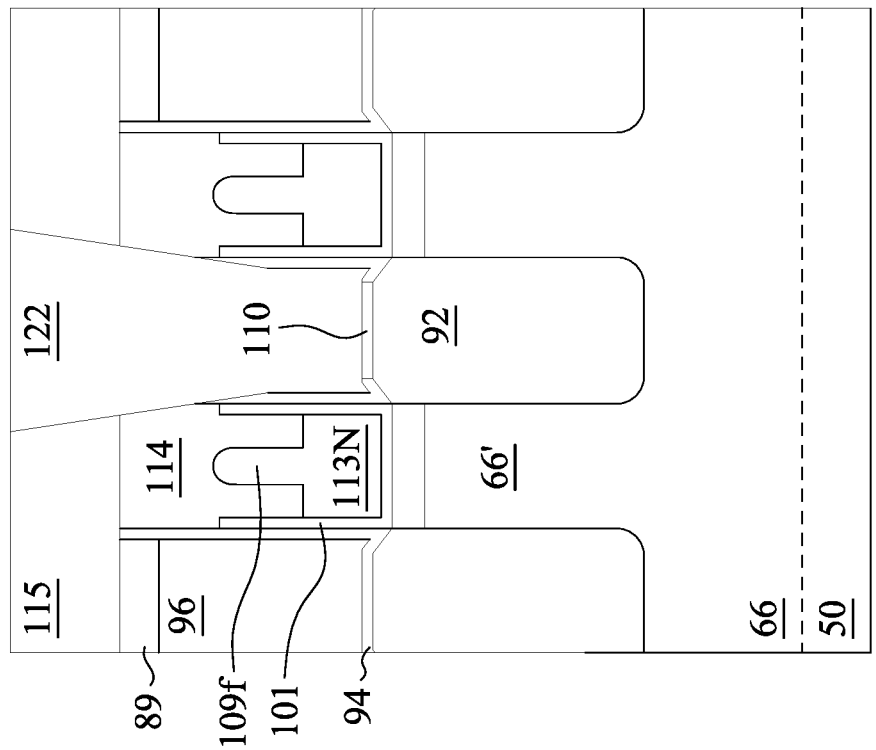

FIGS. 22A-D illustrate cross-sectional views of a device according to some alternative embodiments which utilize a FinFET instead of a nanoFET. FIG. 22A illustrates a cross-section similar to reference cross-section A-A' illustrated in FIG. 1 (except through a FinFET). FIG. 22B illustrates a cross-section similar to reference cross-section B-B' illustrated in FIG. 1 (except through a FinFET). FIG. 22C illustrates a cross-section parallel to the cross-section of FIG. 22B which also through the fin. FIG. 22D illustrates a cross-section similar to reference cross-section C-C' illustrated in FIG. 1 (except through a FinFET. In FIGS. 22A-D, like reference numerals indicate like elements formed by like processes as the structure of FIGS. 20A-D. Rather than having multi-layer stack 64 (see FIG. 2A), the fins 66 are formed from a single semiconductor material. Channel region 66' are areas of the fins 66 which are covered by the gate dielectric layers 100 and gate structures 113. The illustrated structures are the same for both the p-type region 50P and the n-type region 50N, however, the materials of the gate structure 113 and source/drain regions 92 may be different according to which region the device is formed in, as explained above.

Embodiments may achieve advantages. For example, a gate electrode fin provides an increase in contact surface area with an overlying gate contact. In turn, the increased contact surface area provides reduced gate resistance and a more efficient device. Further, the gapfill window can be controlled by controlling the height of the low-k gate dielectric layer, providing flexibility in design choices as gate sizes continue to decrease. Embodiments may be used in both nanoFET and FinFET devices, advantageously providing flexibility in transistor design.

One embodiment is a method including forming a fin over a substrate. The method also includes forming a dummy gate structure over the fin. The method also includes forming a source/drain region on either side of the dummy gate structure. The method also includes depositing a first interlayer dielectric (ILD) over the source/drain region. The method also includes recessing the first ILD and forming a self-align mask over the first ILD. The method also includes performing a gate replacement cycle to replace the dummy gate structure with a replacement metal gate, the gate replacement cycle including: removing the dummy gate structure to form a first recess. The method also includes depositing a gate dielectric in the first recess, forming a metal gate over the gate dielectric, depositing a metal fill over the metal gate, and etching back the gate dielectric, the metal gate, and the metal fill, to thereby forming an electrode fin from the metal fill. The method also includes forming a gate contact contacting a sidewall of the electrode fin.

In an embodiment, the fin includes alternating first nanostructures and second nanostructures under the dummy gate structure, the gate replacement cycle further includes: extending the first recess by removing the first nanostructures under the dummy gate structure. In an embodiment, the gate replacement cycle further includes depositing an adhesive layer over the metal gate before depositing the metal fill. In an embodiment, the electrode fin has vertical seam running down the electrode fin. In an embodiment, the electrode fin has a depression in an upper surface of the electrode fin, the depression corresponding to the vertical seam. In an embodiment, the method further includes: filling an area over the electrode fin with a gate mask; depositing a second ILD over the gate mask; forming a second recess in the second ILD and through the gate mask, the second recess exposing the electrode fin; and forming the gate contact in the second recess. In an embodiment, following forming the electrode fin, a vertical extent of the gate dielectric is further than the electrode fin and a vertical extent of the metal gate is less than the electrode fin. In an embodiment, the gate dielectric includes a first layer of a low-k dielectric material and a second layer of a high-k dielectric material, where etching back the gate dielectric etches the first layer separately from the second layer, the second layer being etched deeper than the first layer. In an embodiment, the high-k dielectric material includes hafnium oxide.

Another embodiment is a method including patterning a semiconductor substrate to form a semiconductor fin. The method also includes forming a dummy gate structure over the semiconductor fin. The method also includes recessing the semiconductor fin on a first side of the dummy gate structure to form a first recess. The method also includes depositing a source/drain region in the first recess. The method also includes depositing a first interlayer dielectric (ILD) over the source/drain region. The method also includes removing the dummy gate structure to form a second recess in the first ILD, the second recess exposing a channel region of the semiconductor fin. The method also includes depositing a gate dielectric in the second recess over the channel region. The method also includes depositing work function layers in the second recess over the gate dielectric. The method also includes depositing a metal fill over the work function layers. The method also includes etching back the gate dielectric and the work function layers to form a third recess in the first ILD, a portion of the metal fill remaining in the third recess as a fin electrode. The method also includes forming a self-aligned contact in the third recess, the self-aligned contact interfacing with vertical portions of the fin electrode.

In an embodiment, the semiconductor fin includes alternating layers of a first nanostructure and a second nanostructure, and the method further includes: forming first inner spacers in the first recess at exposed ends of the first nanostructures; and extending the second recess by removing the layers of the first nanostructures, the channel region including the layers of the second nanostructure separated by the first inner spacers. In an embodiment, the gate dielectric includes a first gate dielectric and a second gate dielectric, where the first gate dielectric includes a low-k dielectric material and the second gate dielectric includes a high-k dielectric material. In an embodiment, the method further includes: recessing the first ILD; and forming a second mask layer over the first ILD, an upper surface of the second mask layer aligned to an upper surface of the dummy gate structure. In an embodiment, forming the self-aligned contact includes: depositing a second ILD over the second mask layer and over the fin electrode; forming an opening through the second ILD, where forming the opening includes using the second mask layer as an etch mask, the opening exposing the fin electrode; and depositing the self-aligned contact in the opening and on the fin electrode.

Another embodiment is a structure including a first nanostructure and a second nanostructure disposed over the first nanostructure, the second nanostructure separated from the first nanostructure by a first inner spacer at one end of the first nanostructure and by a second inner spacer at an opposite end of the first nanostructure. The structure also includes a first source/drain region disposed adjacent the first inner spacer, the first source/drain region contacting the first nanostructure and the second nanostructure. The structure also includes gate structure disposed adjacent the first inner spacer opposite the first source/drain region, the gate structure wrapping around the first nanostructure and the second nanostructure, the gate structure extending vertically higher than the source/drain region, the gate structure including a first dielectric layer, a metal gate, and a gate fill, the gate fill having a fin portion protruding from the metal gate. The structure also includes a gate contact disposed on either side of the fin portion, a portion of the gate contact interposed between the fin portion and the first dielectric layer.

In an embodiment, the structure further includes a second dielectric layer interposed between the first dielectric layer and the metal gate, the second dielectric layer having an opposite k-value from the first dielectric layer. In an embodiment, the first dielectric layer includes a low-k dielectric material, where the second dielectric layer includes a high-k dielectric material, such as a metal oxide or a silicate of hafnium, aluminum, zirconium, lanthanum, manganese, barium, titanium, lead, or a combination thereof. In an embodiment, the first dielectric layer has a vertical extent greater than the fin portion. In an embodiment, the gate contact has a sidewall interface with the fin portion, the sidewall interface having a vertical length between 0 nm and 8 nm. In an embodiment, the fin portion includes a vertical seam down a centerline of the fin portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin over a substrate;
   forming a dummy gate structure over the fin;
   forming a source/drain region on either side of the dummy gate structure;
   depositing a first interlayer dielectric (ILD) over the source/drain region;
   recessing the first ILD and forming a self-align mask over the first ILD;
   performing a gate replacement cycle to replace the dummy gate structure with a replacement metal gate, the gate replacement cycle comprising:

removing the dummy gate structure to form a first recess;
depositing a gate dielectric in the first recess,
forming a metal gate over the gate dielectric,
depositing a metal fill over the metal gate, and
etching back the gate dielectric, the metal gate, and the metal fill, to form an electrode fin from the metal fill; and
forming a gate contact contacting a sidewall of the electrode fin.

2. The method of claim 1, wherein the fin comprises alternating first nanostructures and second nanostructures under the dummy gate structure, the gate replacement cycle further comprising:
extending the first recess by removing the first nanostructures under the dummy gate structure.

3. The method of claim 1, wherein the gate replacement cycle further comprises depositing an adhesive layer over the metal gate before depositing the metal fill.

4. The method of claim 1, wherein the electrode fin has a seam running down the electrode fin.

5. The method of claim 4, wherein the electrode fin has a depression in an upper surface of the electrode fin, the depression corresponding to the seam.

6. The method of claim 1, further comprising:
filling an area over the electrode fin with a gate mask;
depositing a second ILD over the gate mask;
forming a second recess in the second ILD and through the gate mask, the second recess exposing the electrode fin; and
forming the gate contact in the second recess.

7. The method of claim 1, wherein following forming the electrode fin, a vertical extent of the gate dielectric is further than the electrode fin and a vertical extent of the metal gate is less than the electrode fin.

8. The method of claim 1, wherein the gate dielectric comprises a first layer of a low-k dielectric material and a second layer of a high-k dielectric material, wherein etching back the gate dielectric etches the first layer separately from the second layer, the second layer being etched deeper than the first layer.

9. The method of claim 8, wherein the high-k dielectric material comprises hafnium oxide.

10. A method comprising:
patterning a semiconductor substrate to form a semiconductor fin;
forming a dummy gate structure over the semiconductor fin;
recessing the semiconductor fin on a first side of the dummy gate structure to form a first recess;
depositing a source/drain region in the first recess;
depositing a first interlayer dielectric (ILD) over the source/drain region;
removing the dummy gate structure to form a second recess in the first ILD, the second recess exposing a channel region of the semiconductor fin;
depositing a gate dielectric in the second recess over the channel region;
depositing work function layers in the second recess over the gate dielectric;
depositing a metal fill over the work function layers;
etching back the gate dielectric and the work function layers to form a third recess in the first ILD, a portion of the metal fill remaining in the third recess as a fin electrode; and
forming a self-aligned contact in the third recess, the self-aligned contact interfacing with vertical portions of the fin electrode.

11. The method of claim 10, wherein the semiconductor fin comprises alternating layers of a first nanostructure and a second nanostructure, further comprising:
forming first inner spacers in the first recess at exposed ends of the first nanostructures; and
extending the second recess by removing the layers of the first nanostructures, the channel region comprising the layers of the second nanostructure separated by the first inner spacers.

12. The method of claim 10, wherein the gate dielectric comprises a first gate dielectric and a second gate dielectric, wherein the first gate dielectric comprises a low-k dielectric material and the second gate dielectric comprises a high-k dielectric material.

13. The method of claim 10, further comprising:
recessing the first ILD; and
forming a second mask layer over the first ILD, an upper surface of the second mask layer aligned to an upper surface of the dummy gate structure.

14. The method of claim 13, wherein forming the self-aligned contact comprises:
depositing a second ILD over the second mask layer and over the fin electrode;
forming an opening through the second ILD, wherein forming the opening includes using the second mask layer as an etch mask, the opening exposing the fin electrode; and
depositing the self-aligned contact in the opening and on the fin electrode.

15. A method comprising:
forming a dielectric layer, the dielectric layer having a recess, the recess exposing a channel region;
depositing a gate dielectric in the recess;
forming one or more conductive layers in the recess over the gate dielectric;
forming a metal fill in the recess over the one or more conductive layers to completely fill the recess;
recessing the gate dielectric, the one or more conductive layers, and the metal fill, wherein after recessing the metal fill forms a protruding electrode that protrudes above an upper surface of the one or more conductive layers; and
forming a gate contact in the recess, the gate contact extending along sidewalls of the protruding electrode.

16. The method of claim 15, wherein the gate dielectric protrudes above an upper surface of the one or more conductive layers.

17. The method of claim 16, wherein the protruding electrode protrudes above an upper surface of the gate dielectric.

18. The method of claim 15, wherein the gate dielectric comprises a low-k dielectric layer and a high-k dielectric layer.

19. The method of claim 15, wherein an upper surface of the protruding electrode is concave.

* * * * *